US009899470B2

(12) United States Patent
Lemke et al.

(10) Patent No.: US 9,899,470 B2
(45) Date of Patent: Feb. 20, 2018

(54) METHOD FOR FORMING A POWER SEMICONDUCTOR DEVICE AND A POWER SEMICONDUCTOR DEVICE

(71) Applicant: Infineon Technologies Austria AG, Villach (AT)

(72) Inventors: Marko Lemke, Dresden (DE); Knut Stahrenberg, Dresden (DE); Ralf Rudolf, Dresden (DE); Rolf Weis, Dresden (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/597,194

(22) Filed: May 17, 2017

(65) Prior Publication Data

US 2017/0345892 A1 Nov. 30, 2017

(30) Foreign Application Priority Data

May 24, 2016 (DE) ........................ 10 2016 109 555

(51) Int. Cl.
*H01L 29/06* (2006.01)
*H01L 21/762* (2006.01)
(Continued)

(52) U.S. Cl.
CPC .... *H01L 29/0634* (2013.01); *H01L 21/26506* (2013.01); *H01L 21/30604* (2013.01);
(Continued)

(58) Field of Classification Search
CPC ............ H01L 29/0634; H01L 27/0629; H01L 21/30604; H01L 27/085; H01L 29/66477;
(Continued)

(56) References Cited

U.S. PATENT DOCUMENTS 6,285,060 B1 * 9/2001 Korec ................. H01L 29/1095
257/331
6,649,459 B2 * 11/2003 Deboy ................ H01L 29/0634
257/E21.345

(Continued)

FOREIGN PATENT DOCUMENTS

DE 102015107977 A1 11/2015

*Primary Examiner* — William Coleman
(74) *Attorney, Agent, or Firm* — Murphy, Bilak & Homiller, PLLC

(57) ABSTRACT

A method of forming a power semiconductor device includes providing a semiconductor layer of a first conductivity type extending to a first side and having a first doping concentration of first dopants providing majority charge carriers of a first electric charge type in the layer, and forming a deep trench isolation including forming a trench which extends from the first side into the semiconductor layer and includes, in a vertical cross-section perpendicular to the first side, a wall, forming a compensation semiconductor region of the first conductivity type at the wall and having a second doping concentration of the first dopants higher than the first doping concentration, and filling the trench with a dielectric material. The amount of first dopants in the compensation semiconductor region is such that a field-effect of fixed charges of the first electric charge type which are trapped in the trench is at least partly compensated.

20 Claims, 24 Drawing Sheets

(51) Int. Cl.
    *H01L 21/265*     (2006.01)
    *H01L 21/306*     (2006.01)
    *H01L 29/66*     (2006.01)
    *H01L 27/06*     (2006.01)
    *H01L 27/085*     (2006.01)

(52) U.S. Cl.
    CPC .... *H01L 21/76224* (2013.01); *H01L 27/0629* (2013.01); *H01L 27/085* (2013.01); *H01L 29/0692* (2013.01); *H01L 29/6609* (2013.01); *H01L 29/66477* (2013.01)

(58) Field of Classification Search
    CPC ........... H01L 21/26506; H01L 29/0692; H01L 29/6609; H01L 21/76224
    See application file for complete search history.

(56) References Cited

U.S. PATENT DOCUMENTS

| | | | |
|---|---|---|---|
| 8,344,451 B2 * | 1/2013 | Darwish | H01L 29/0634 |
| | | | 257/329 |
| 9,219,138 B2 * | 12/2015 | Roig-Guitart | H01L 29/66712 |
| 9,515,199 B2 * | 12/2016 | Van Brunt | H01L 29/872 |
| 9,570,576 B2 * | 2/2017 | Meiser | H01L 21/76898 |
| 9,685,523 B2 * | 6/2017 | Bobde | H01L 29/6609 |
| 2009/0294892 A1 * | 12/2009 | Paul | H01L 29/0649 |
| | | | 257/494 |
| 2010/0327344 A1 * | 12/2010 | Paul | H01L 21/26586 |
| | | | 257/330 |
| 2015/0270333 A1 | 9/2015 | Yang et al. | |

\* cited by examiner

METHOD FOR FORMING A POWER SEMICONDUCTOR DEVICE AND A POWER SEMICONDUCTOR DEVICE

TECHNICAL FIELD

Embodiments of the present invention relate to methods for forming a power semiconductor device, in particular to methods for forming power semiconductor switches, and to power semiconductor devices.

BACKGROUND

Particularly with regard to power devices capable of switching large currents and/or operating at higher voltages, both high breakdown voltages $U_{bd}$ and low on-resistance $R_{on}$ are often desired.

Power semiconductor switches often handle voltages differences of more than several 10 V or even several 100 V within the same semiconductor piece. To avoid breakdown during blocking mode, drift zones are used. The dimension of the drift zones depend on the breakdown voltage $U_{bd}$, which has to be blocked, but also on the doping level of the semiconductor material. For lateral devices, the size of the drift zone mainly determines the size of the chip and has, thus, a high influence on costs. To keep wafer cost low, the doping level of the wafer material should be low too. Wafer material doped at a level of about $10^{15}/cm^3$ enables small drift zone dimensions, while still having enough doping concentration too keep also $R_{on}$ low enough to enable a decent ON-state of the switch.

Small chip size may also be achieved, if the drift zone is arranged in a vertical structure. However, at the edge of such structures again high voltage differences to neighboring structures may occur. Effective isolation between regions of high voltage differences is often required. Such isolations may be realized with oxide filled trenches, so called Shallow Trench Isolations or Deep Trench Isolations. However, a leakage path may occur at the semiconductor-oxide interface. This may hinder the desired blocking behavior.

For these and other reasons there is a need for the present invention.

SUMMARY

According to an embodiment of a method of forming a power semiconductor device, the method includes providing a semiconductor layer of a first conductivity type extending to a first side and comprising a first doping concentration of first dopants providing majority charge carriers of a first electric charge type in the semiconductor layer, and forming a deep trench isolation. Forming the deep trench isolation includes forming a trench which extends from the first side into the semiconductor layer and comprises, in a vertical cross-section perpendicular to the first side, a wall, forming a compensation semiconductor region of the first conductivity type at the wall, the compensation semiconductor region including a second doping concentration of the first dopants which is higher than the first doping concentration, and filling the trench with a dielectric material. An amount of the first dopants in the compensation semiconductor region is such that a field-effect of fixed charges of the first electric charge type, which are trapped in the trench, is at least partly compensated next to the wall.

According to an embodiment of a method of forming a power semiconductor device, the method includes providing a wafer including a first side and a semiconductor layer of a first conductivity type, etching a trench from the first side into the semiconductor layer so that the trench has in a vertical cross-section perpendicular to the first side two sidewalls, forming a compensation semiconductor region of the first conductivity type extending along the two sidewalls, and filling the trench with a dielectric material. The method is performed so that, in the vertical cross-section, an amount of dopants of the first conductivity type in the compensation semiconductor region times a number of majority charge carriers per unit, which are provided by the dopants of the first conductivity type in the compensation semiconductor region, is at least about an absolute value of a non-vanishing total charge of trapped charges in the trench divided by the elementary charge, wherein the total charge is of the same electric charge type as the majority charge carriers.

According to an embodiment of a power semiconductor device, the power semiconductor device includes a semiconductor body including a first side and a semiconductor layer extending to the first side and comprising first dopants providing majority charge carriers of a first electric charge type in the semiconductor layer. At least one deep trench extends from the first side into the semiconductor layer and includes, in a vertical cross-section perpendicular to the first side, a wall and a dielectric region comprising fixed charges of the first electric charge type. A compensation semiconductor region is arranged at the wall and has a higher concentration of first dopants than the semiconductor layer. The dielectric region extends along the wall and/or along the compensation semiconductor region. An amount of the first dopants in the compensation semiconductor region is such that a field-effect of the fixed charges is, next to the wall, at least partly compensated.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

Figure 1:
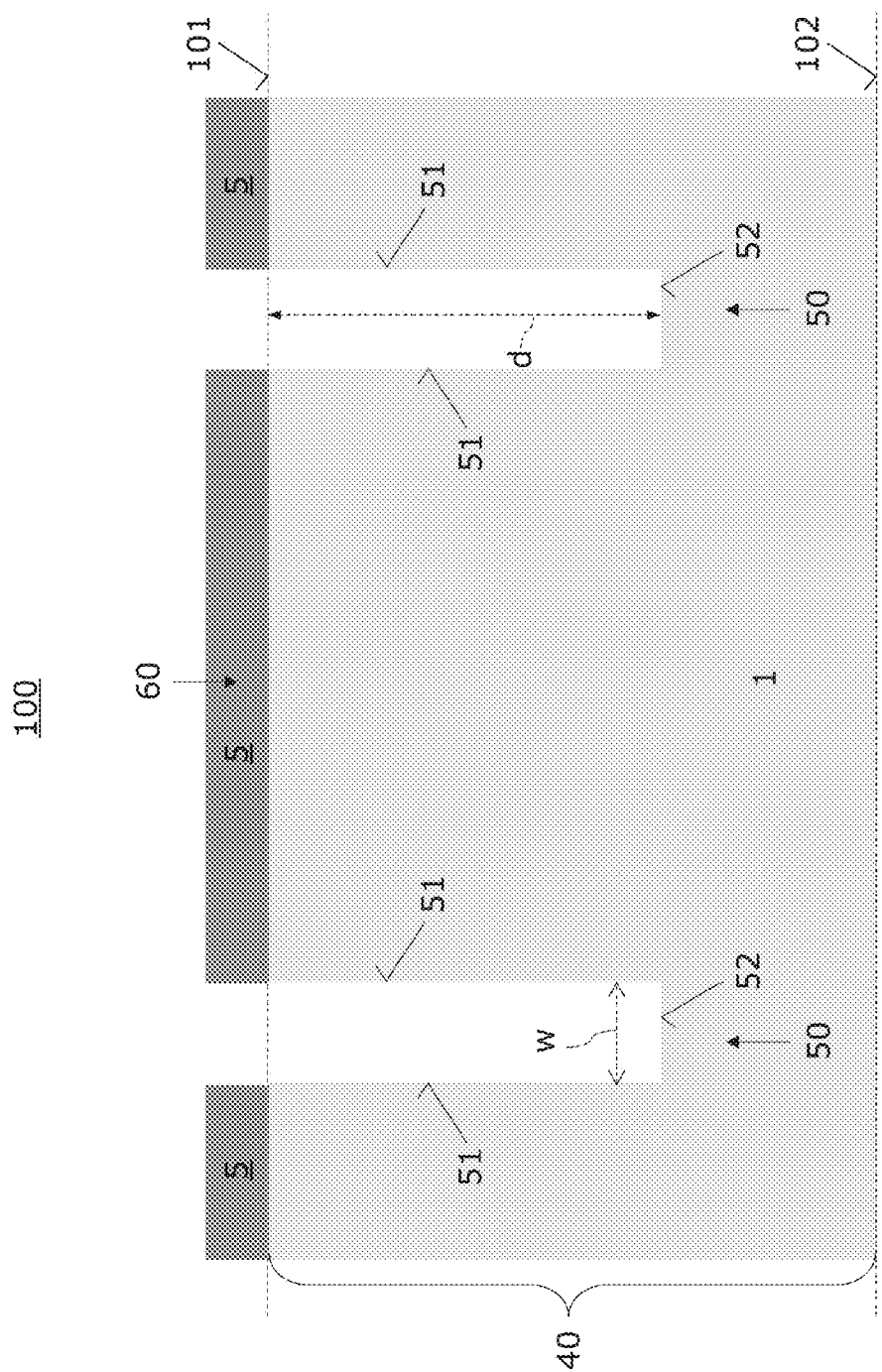
FIGS. 1 to 7 illustrate method steps of a method for forming a power semiconductor device on wafer level in respective vertical cross-sections through a wafer according to embodiments.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main horizontal side of a semiconductor substrate or body. This can be for instance the surface of a wafer or a die.

The term "vertical" as used in this specification intends to describe an orientation which is substantially arranged perpendicular to the first side, i.e. parallel to the normal direction of the first side of the semiconductor substrate or body.

In this specification, p-doped is referred to as first conductivity type while n-doped is referred to as second conductivity type. The majority charge carriers of a p-doped semiconductor material are holes, i.e. positive charge carriers also referred to as charge carriers of the first electric charge type. Alternatively, the semiconductor devices can be formed with opposite doping relations so that the first conductivity type can be n-doped and the second conductivity type can be p-doped. Furthermore, some Figures illustrate relative doping concentrations by indicating "−" or "+" next to the doping type. For example, "p−" means a doping concentration which is less than the doping concentration of an "p"-doping region while an "p+"-doping region has a larger doping concentration than the "p"-doping region. However, indicating the relative doping concentration does not mean that doping regions of the same relative doping concentration have to have the same absolute doping concentration unless otherwise stated. For example, two different p+-doping regions can have different absolute doping concentrations. The same applies, for example, to an n+-doping and a p+-doping region.

Specific embodiments described in this specification pertain to, without being limited thereto, manufacturing power semiconductor devices on wafer level and the manufactured power semiconductor devices.

When referring to semiconductor devices, at least two-terminal devices are meant, an example is a diode. Semiconductor devices can also be three-terminal devices such as a field-effect transistors (FETs), in particular fin field-effect transistors (FinFETs), insulated gate bipolar transistors (IGBTs), junction field effect transistors (JFETs), and thyristors to name a few. The semiconductor devices can also include more than three terminals. Further, the semiconductor devices can also include several two-terminal devices and/or three-terminal devices on a single chip.

The term "power semiconductor device" as used in this specification intends to describe a semiconductor device on a single chip with high voltage and/or high current switching capabilities. In other words, power semiconductor devices are intended for high current, typically in the ampere range. Within this specification the terms "power semiconductor device" and "power semiconductor component" are used synonymously.

A power semiconductor device may have an active area with a plurality of FET-cells (field-effect-transistor-cells such as MOSFET-cells, IGBT-cells and reverse conducting IGBT-cells) for controlling a load current between two load metallization. Furthermore, the power semiconductor device may have a peripheral area at least partially surrounding an active area when seen from above and typically having at least one edge-termination structure.

The term "edge-termination structure" as used in this specification intends to describe a structure that is configured to provide in a blocking mode a transition region in which the high electric fields around an active area of the semiconductor device change gradually to the potential at or close to the edge of the device and/or between a reference potential such as ground and a high voltage e. g. at the edge and/or backside of the semiconductor device. The edge-termination structure may, for example, lower the field intensity around a termination region of a rectifying junction by spreading the electric field lines across the termination region.

The term "field-effect" as used in this specification intends to describe the modulation of the electrical conductivity of a semiconductor material or region by the application of an external electric field. The external electric field may be caused by external electric charges arranged next to the semiconductor material or region. When the external electric charges are of the same charge type as the majority charge carriers of the semiconductor material or region, e.g, positive charges for a p-type the semiconductor material or region, a depletion layer or even a conductive "inversion channel" may be formed in the semiconductor material or region due to the "field-effect".

In the context of the present specification, the term "gate electrode" intends to describe an electrode which is situated next to, and configured to form and/or control a channel region due to the field-effect. The term "gate electrode" shall embrace an electrode or conductive region which is situated next to, and insulated from the body region by an insulating region forming a gate dielectric region and configured to form and/or control a channel region through the body region by charging to an appropriate voltage.

In the context of the present specification, the terms "in ohmic contact", in resistive electric contact" and "in resistive electric connection" intend to describe that there is an ohmic current path between respective elements or portions of a semiconductor device at least when no voltages or only low testing voltages are applied to and/or across the semiconductor device. Likewise, the terms in low ohmic contact, "in low resistive electric contact" and "in low resistive electric connection" intend to describe that there is a low resistive ohmic current path between respective elements or portions of a semiconductor device at least when no voltages or only low testing voltages are applied to and/or across the semiconductor device. Within this specification the terms "in low ohmic contact", "in low resistive electric contact", and "in low resistive electric connection" are used synonymously.

In the following, embodiments pertaining to semiconductor devices and manufacturing methods for forming semiconductor devices are explained mainly with reference to silicon (Si) semiconductor devices having a monocrystalline Si semiconductor body. Accordingly, a semiconductor region or layer is typically a monocrystalline Si-region or Si-layer if not stated otherwise.

It should, however, be understood that the semiconductor body can be made of any semiconductor material suitable for manufacturing a semiconductor device. For power semiconductor applications currently mainly Si, SiC, GaAs and GaN materials are used. If the semiconductor body is made of a wide band-gap material, i.e. of a semiconductor material with a band-gap of at least about two electron volts such as SiC or GaN and having a high breakdown field strength and high critical avalanche field strength, respectively, the doping of the respective semiconductor regions can be chosen higher which reduces the on-state resistance $R_{on}$.

FIG. 1 to FIG. 7 illustrate processes of a method for forming a power semiconductor device 100, 100' on wafer-level.

In a first process, a wafer 40 having a p-doped silicon semiconductor layer 1 may be provided. Accordingly, the semiconductor layer 1 is made of silicon doped with dopants providing holes (positive electric charges) as majority charge carriers. In the following, these dopants are also referred to as first dopants.

The semiconductor layer 1 may e.g. be slightly doped with boron acting as acceptor in silicon and providing one hole per unit in silicon, respectively.

Typically the doping concentration of the dopants is in a range from about $10^{13}/cm^3$ to about $10^{15}/cm^3$, more typically in a range from about $10^{15}/cm^3$ to about $2*10^{15}/cm^3$ for dopants providing one positive charge carrier per unit.

The semiconductor layer 1 may extend between and/or even form a first side 101 and a second side 102 opposite the first side 101.

Thereafter, a trench 50 extending from the first side 101 into the semiconductor layer 1 is formed.

As illustrated in FIG. 1, the trench 50 may be etched from the first side 101 using a mask 5 formed on the first side 101. Mask 5 is typically a photo lithographically structured hardmask, for example a structured silicon oxide mask.

FIG. 1 may correspond to a section through one power semiconductor device 100 of a plurality of power semiconductor devices 100 to be manufactured in parallel on wafer level or even to a section of a part of such a device 100.

As illustrated in FIG. 1, two or more trenches 50 may be formed in the shown vertical section of the power semiconductor device 100 to be manufactured. Accordingly, one or more mesas 60 may be formed.

In the vertical section, each trench 50 may have two typically straight sidewalls 51 and a typically straight bottom wall 52 forming the respective wall 51, 52 of the trench 50. In the following the sidewalls 51 and the bottom wall 52 of a trench 50 are also referred to as side portion 51 of the wall and bottom portion 52 of the wall, respectively.

The vertical extension d of the trenches 50 is typically at least about 5 μm (deep trench), for example in a range from about 6 μm to about 7 μm.

Further, the horizontal extension (distance of sidewalls 51) w of each trench 50 is typically smaller than the vertical extension d.

The aspect ratio d/w of the trenches 50 may be larger than 2 or even 5.

Figure 2:
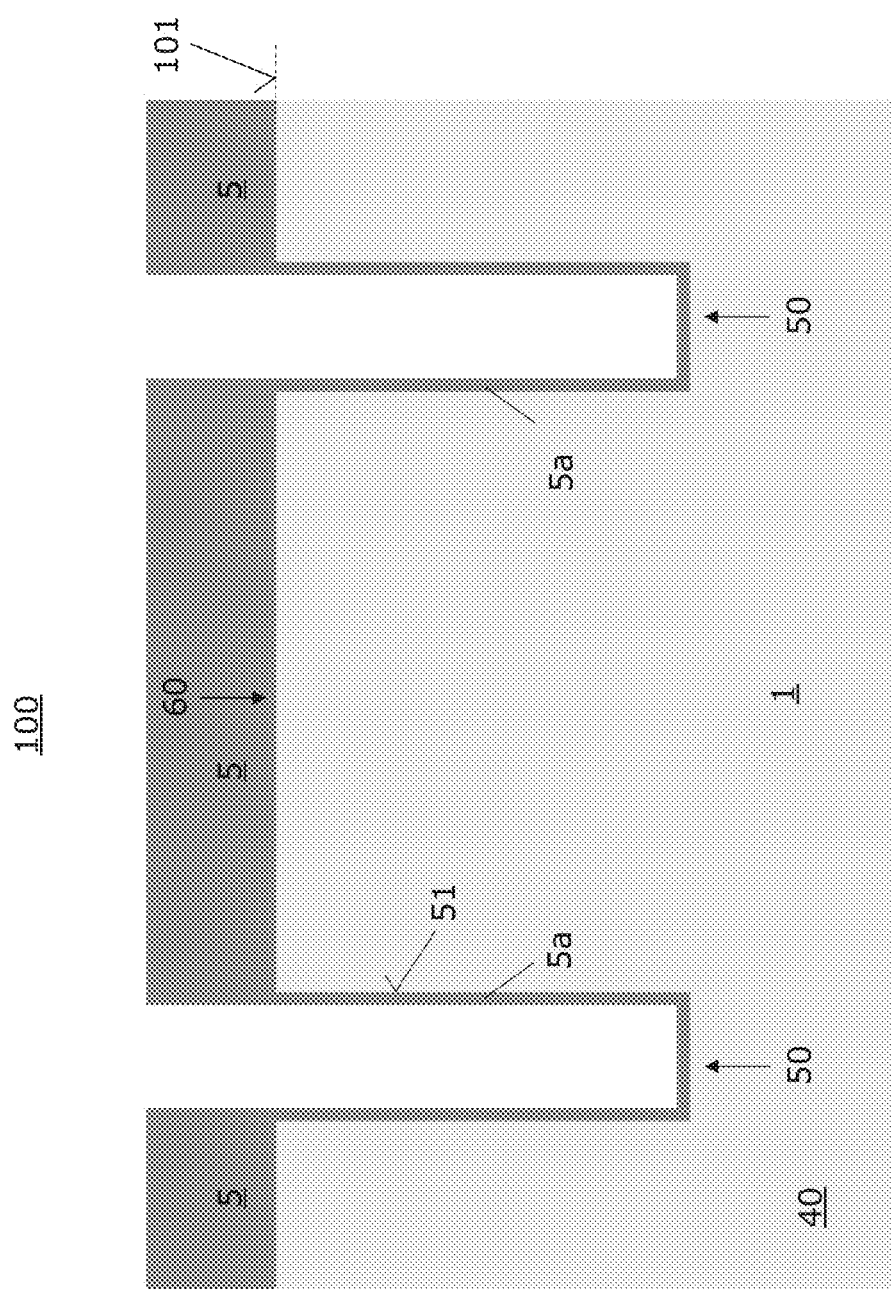

Thereafter, a first silicon oxide layer 5a covering the sidewalls 51 and the bottom walls 52 may be deposited. The resulting structure 100 is illustrated in FIG. 2.

The first silicon oxide layer 5a is typically comparatively thin, e.g. about 5 nm to about 20 nm thick, more typically 5 nm to about 10 nm thick.

Figure 3:
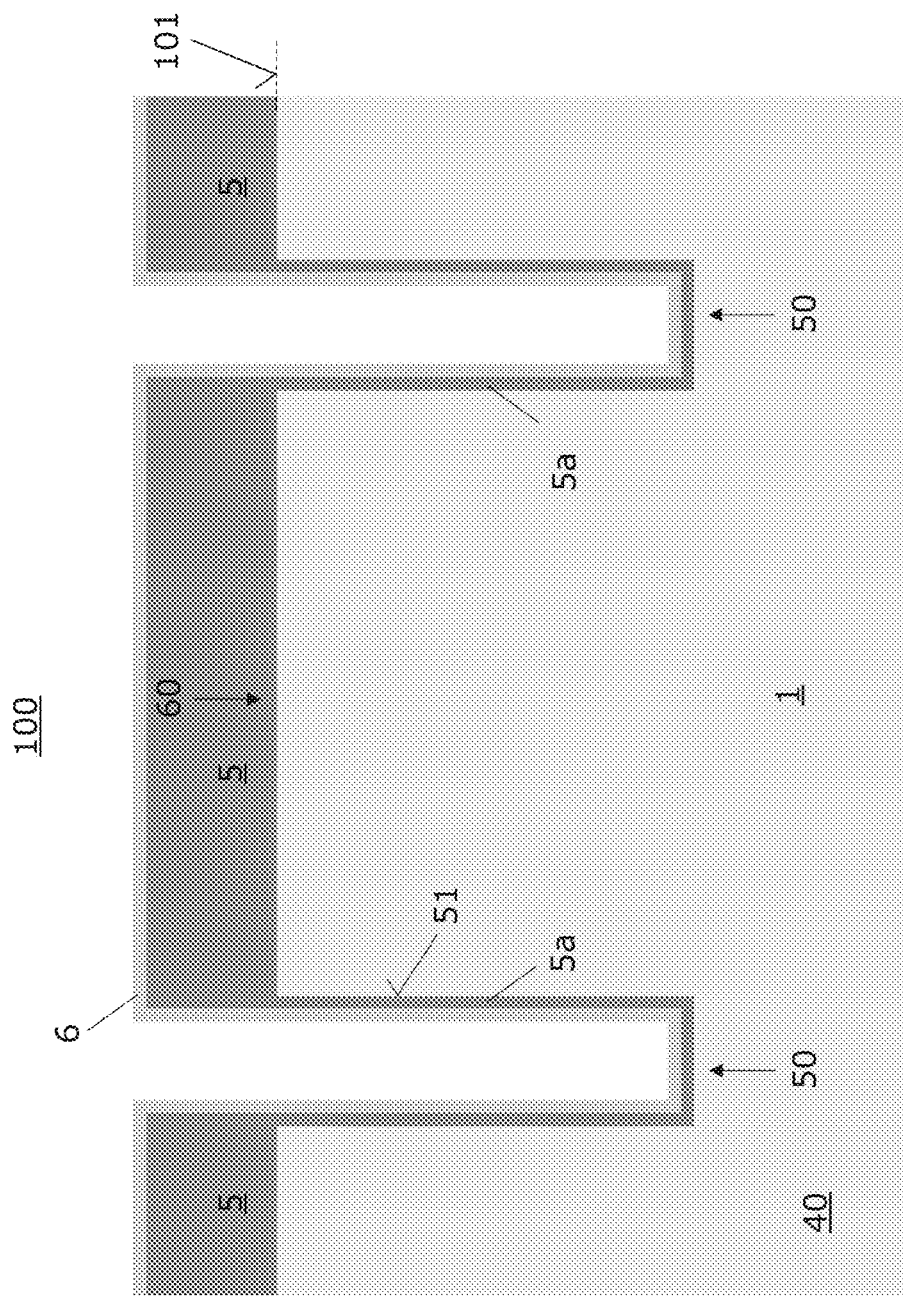

Thereafter, a semiconductor layer 6 doped with the first dopants may be formed at the sidewalls 51 and bottom walls 52. For example, a highly boron doped poly-Si layer 6 may be formed by conformal deposition. The resulting structure 100 is illustrated in FIG. 3.

The semiconductor layer 6 may, depending on doping concentration, also be comparatively thin, e.g. about 5 nm to about 20 nm thick, more typically 5 nm to about 10 nm thick.

Figure 4:
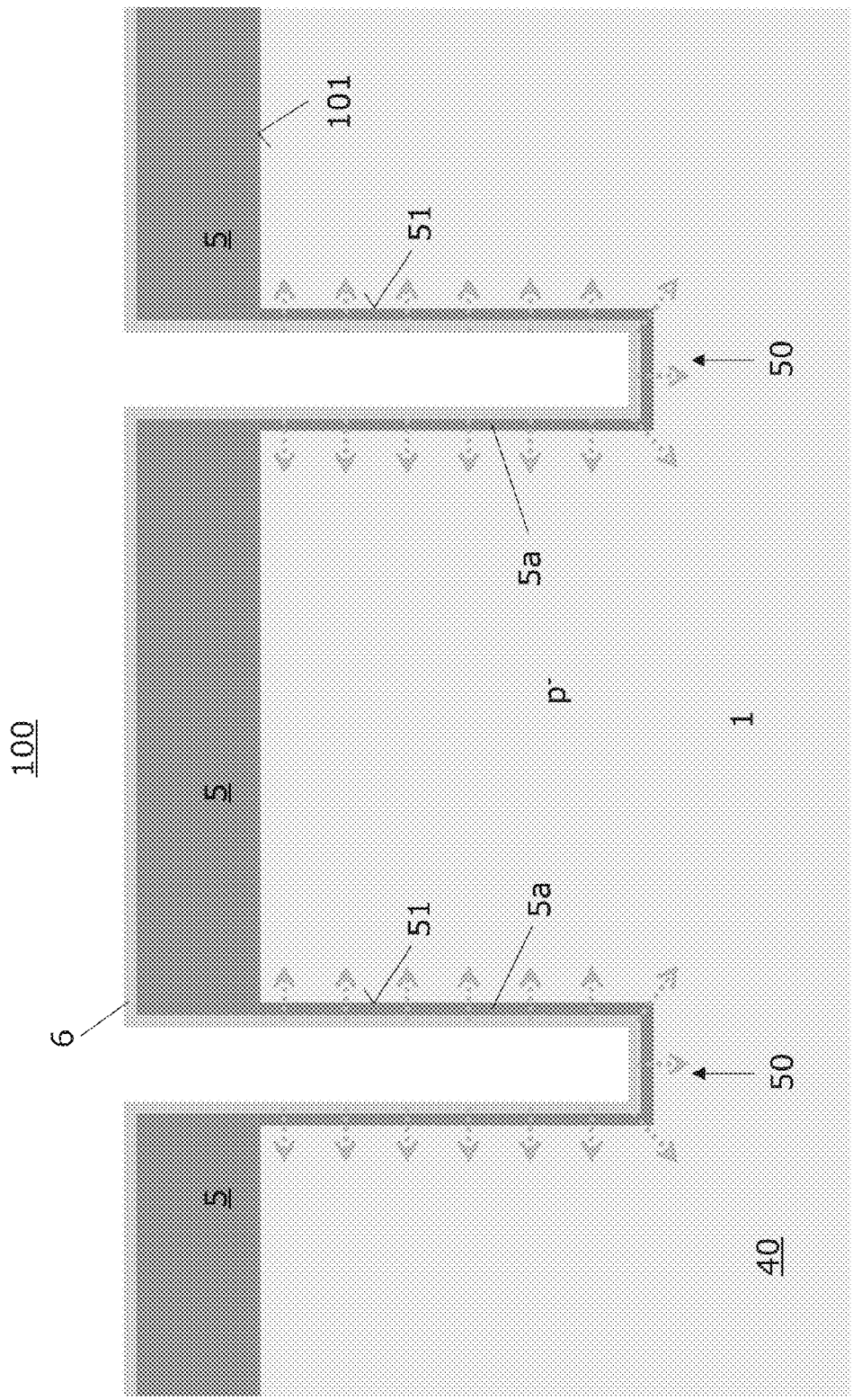

As illustrated by the dotted arrows in FIG. 4, a subsequent thermal process may be used to outdiffuse the first dopants from the semiconductor layer 6 through the f first silicon oxide layer 5a into adjoining the portions of the semiconductor layer 1.

This result in forming a p-type compensation semiconductor region 1a along the sidewalls 51 and the bottom wall 52 of each trench 50 with a typically at least ten times higher doping concentration than the remaining semiconductor layer 1.

Thereafter, the semiconductor layer 6 may be removed, typically by isotropic dry or wet etch, selective to the first silicon oxide layer 5a.

Figure 5:
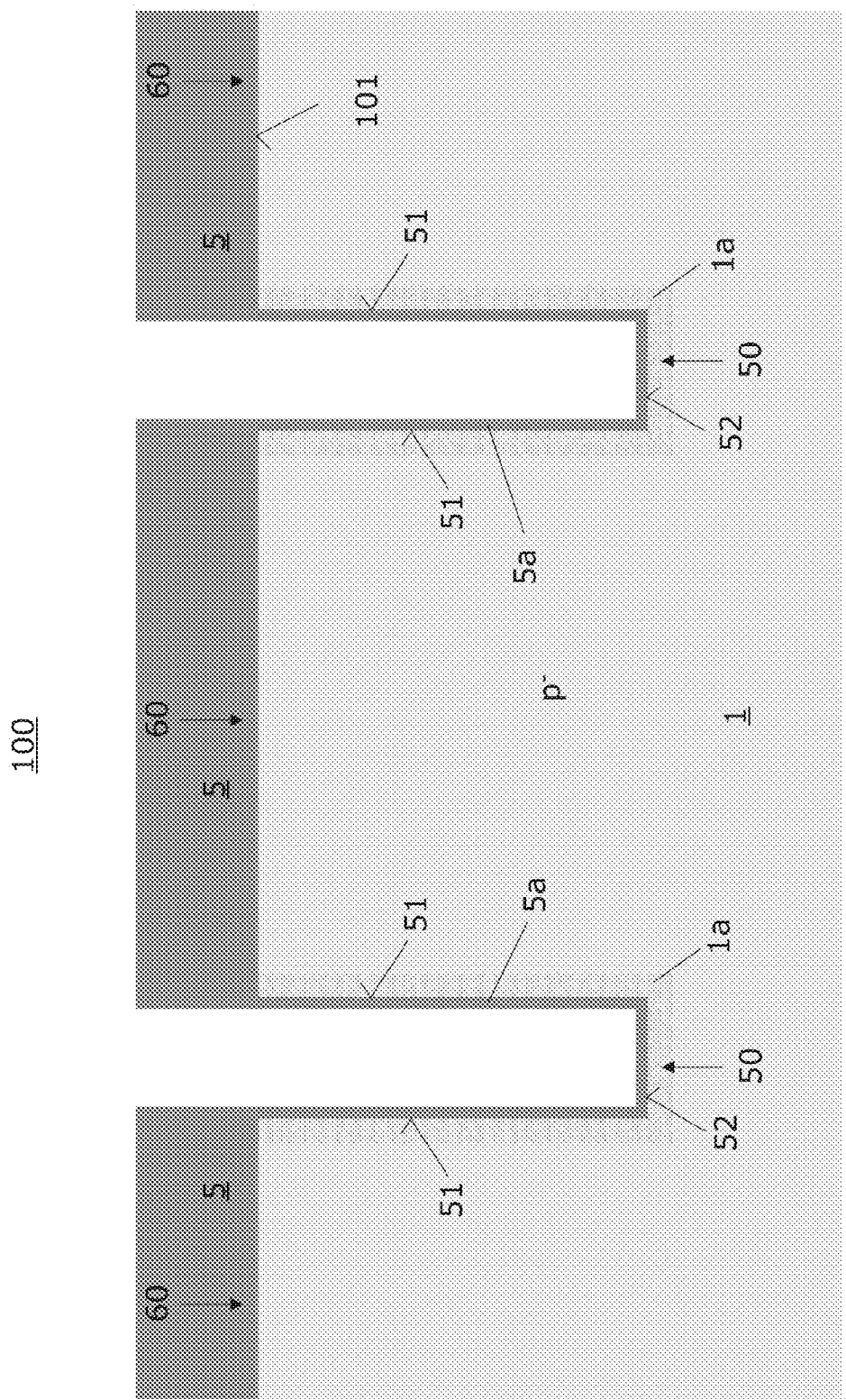

As illustrated in FIG. 5, the thickness of the compensation semiconductor region(s) 1a is typically comparatively small. The thickness of the compensation semiconductor region(s) 1a may be in a range from about 5 nm to about 100 nm, more typically from about 10 nm to about 50 nm.

Figure 6:
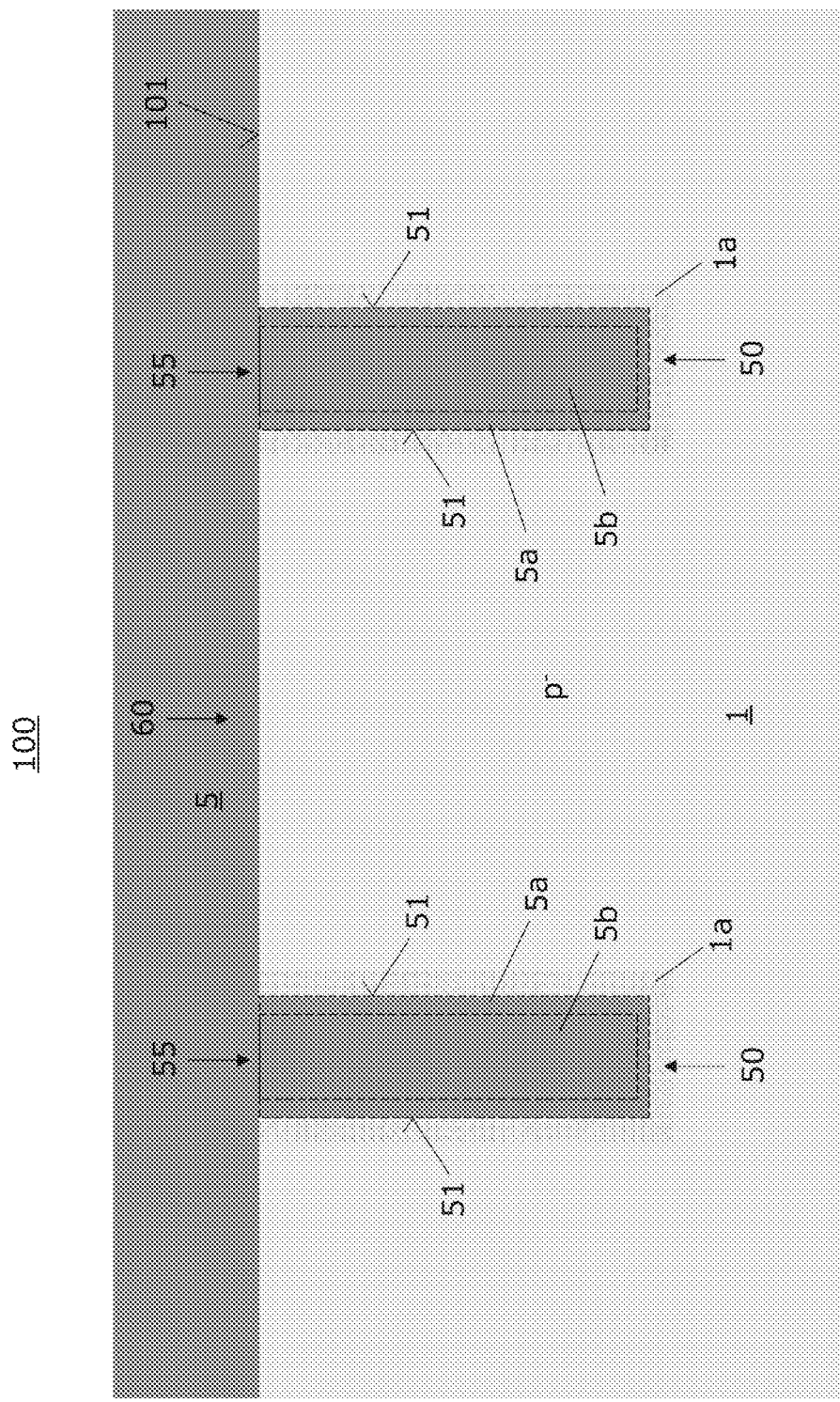

Thereafter, a second silicon oxide layer 5b may be deposited to fill the trench(es) 50. The resulting structure 100 is illustrated in FIG. 6.

Thereafter, any remainders of the oxide layers 5, 5b on the first side and the mask 5 may be removed. This may be achieved by dry etching, wet etching and/or chemical mechanical polishing (CMP).

Figure 7:
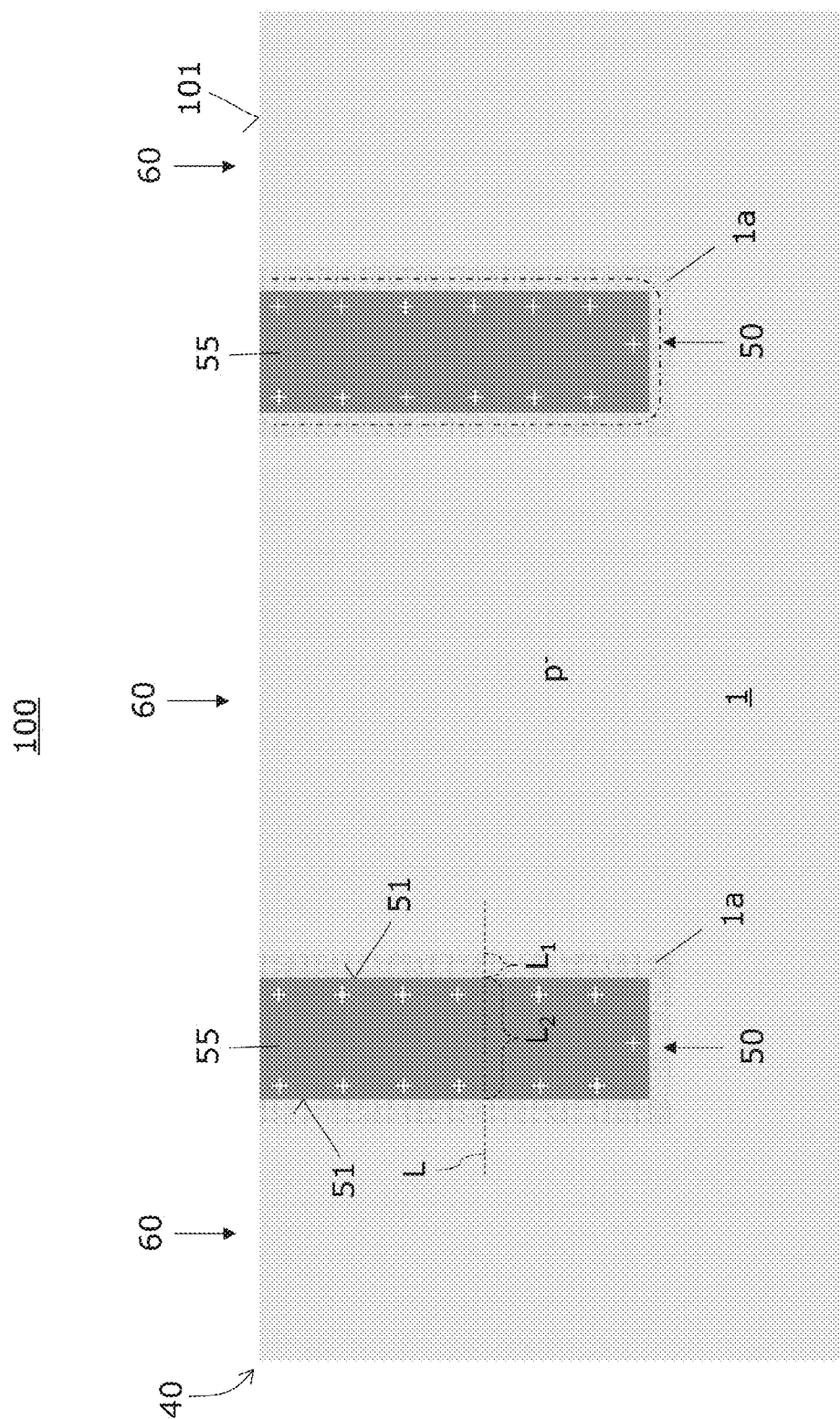

As illustrated by the "+" symbols in FIG. 7, positive charges may be trapped in the trench(es) 50 during manufacturing. Forming of such intrinsic charges in dielectrics next to semiconductor material is difficult or impractical to avoid during manufacturing. The intrinsic charges, in the following also referred to as fixed charges and trapped charges, may be trapped in a dielectric material or at an interface formed with a semiconductor material or a different dielectric material. Sometimes the intrinsic charges are positive, like in silicon oxide, and sometimes the charges are negative. Close to the semiconductor—dielectric interface, in particular a silicon-silicon oxide interface (Si/SiO$_2$ interface), the fixed charges have a field-impact to the semiconductor material (silicon). This field impact becomes more significant with lowering the doping level of the semiconductor material (silicon).

At low enough doping level, a leakage path as illustrated by the u-shaped dash-dotted curve next to the right trench 50 in FIG. 7 may be formed along the Si/SiO$_2$ interface in the low p-doped adjoining semiconductor material and hinder a decent voltage blocking. This can be avoided by a large enough amount of first dopants in the compensation semiconductor region 1a.

To keep the overall doping level of the semiconductor layer 1 low as often desired in power applications, the higher doped compensation semiconductor region 1a is typically formed only close to or even only in close proximity to semiconductor-dielectric interface of up to a few or a few ten nanometers and the trench 50, respectively.

In some embodiments (not shown in FIG. 7), it is sufficient to interrupt forming of an otherwise continuous depletion layer or a continuous inversion channel, which may e.g. be formed between adjacent mesas 60 of the semiconductor layer 1, by a higher doped compensation semiconductor region 1a formed only at a portion of the wall, for example at the bottom wall 52 or at one of the sidewalls 51.

Determining the desired doping level of the compensation semiconductor region 1a may include estimating the amount of the fixed charges expected due to the dielectric filling of the trench 50. This may be based on experience and/or simulation.

The desired doping level of the compensation semiconductor region 1a may be determined from the relation:

$$N_1 * I_1 >= I_2/(2*e),$$

where e, N1, I1, and I2 refer to the elementary charge, the number of the majority charge carriers per unit provided by the first dopants in the semiconductor material (N1=1 for boron in silicon), a line integral of the doping concentration along a first curve L1, which runs through the compensation semiconductor region 1a, and line integral of a concentration of the fixed charges (+) along a second curve L2 which runs through the trench 50, and wherein the first curve L1 and the second curve L2 form respective line segments of a straight line L perpendicular to the interface and the respective wall portion 51, 52, respectively.

For typical boron doping concentrations of the semiconductor layer 1 in a range between about $10^{15}/cm^3$ and about $10^{16}/cm^3$ and SiO2 as dielectric trench filling 55, the first quantity I1 is typically in a range between about $10^{10}/cm^2$ and about $10^{11}/cm^2$.

The doping concentration of the first dopants is typically at least one order of magnitude higher in the compensation semiconductor region 1a compared to the semiconductor layer 1.

The doping concentration of the first dopants in the compensation semiconductor region 1a may be larger than $10^{17}/cm^3$, $10^{18}/cm^3$ or even $5*10^{18}/cm^3$.

To keep the average doping level of the semiconductor layer 1 and the compensation semiconductor region 1a low, N1*I1<=I2/e is typically also ensured.

In embodiments in which the the dielectric material 55 in the trench 50 is, in the vertical cross-section, surrounded by the compensation semiconductor region 1a except at the first side 101 as shown in FIG. 7, the amount of the first dopants in the compensation semiconductor region 1a may also be determined so that that the amount of the first dopants times N1 is at least about (and typically less than twice) an absolute value of the expected total charge of trapped charges (+) in the trench 50 divided by the elementary charge e.

The doping level of the compensation semiconductor region 1a may also be somewhat smaller, for example 20% or 25% smaller compared to ideal compensation of fixed charges, when only a partial compensation is reasonable.

After or prior to forming the deep trench isolation including the compensation semiconductor region 1a, further manufacturing processes may be used to form devices in the mesa(s) 60. This may include forming next to the trenches 50 field-effect structure(s), for example FinFET-structures, diode structure(s) and/or edge-termination structures.

Further device manufacturing from the first side 101 may include processes like implanting dopants, annealing, etching shallow trenches from the first side 101 into the semiconductor layer 1, insulating sidewalls of the shallow trenches, forming insulated gate electrodes in the shallow trenches, forming insulated gate electrodes on and/or at the first side 101, and forming contact metallizations on the first side 101.

Further device manufacturing from the second side 102 may include implanting dopants, forming a contact metallizations on the second side 101 and the like.

Thereafter, the wafer 40 may be singulated into individual chips 100.

Figure 8:
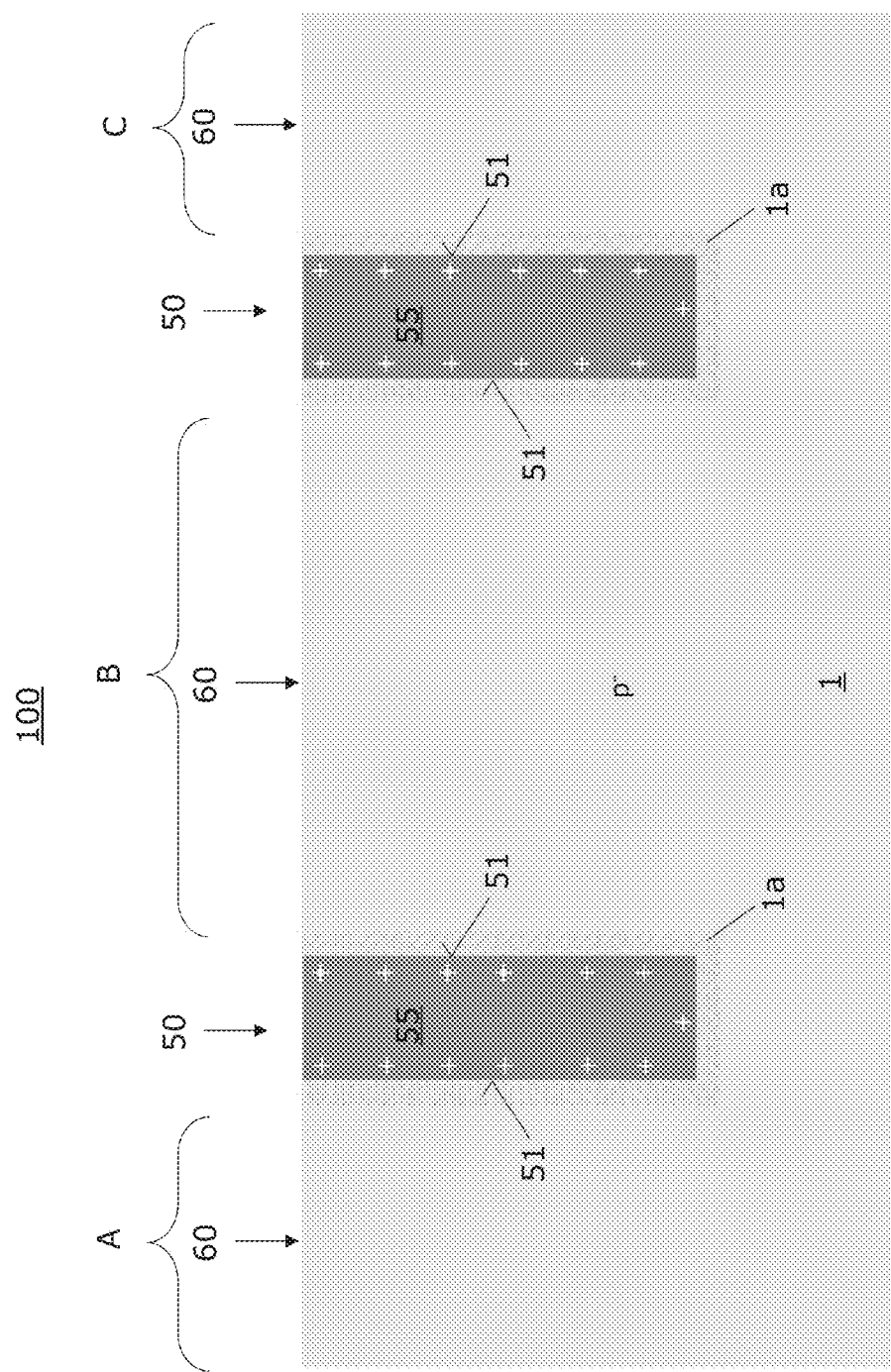
FIG. 8 illustrates a vertical cross-section through a power semiconductor device according to an embodiment.

Due to the compensation semiconductor regions 1a of the deep trench isolations 1a, 50, 55, the device structures formed in the mesas 60 are well protected against leakage currents. Accordingly, the devices may safely be operated at different voltage levels A, B, C as illustrated in FIG. 8.

Figure 9:
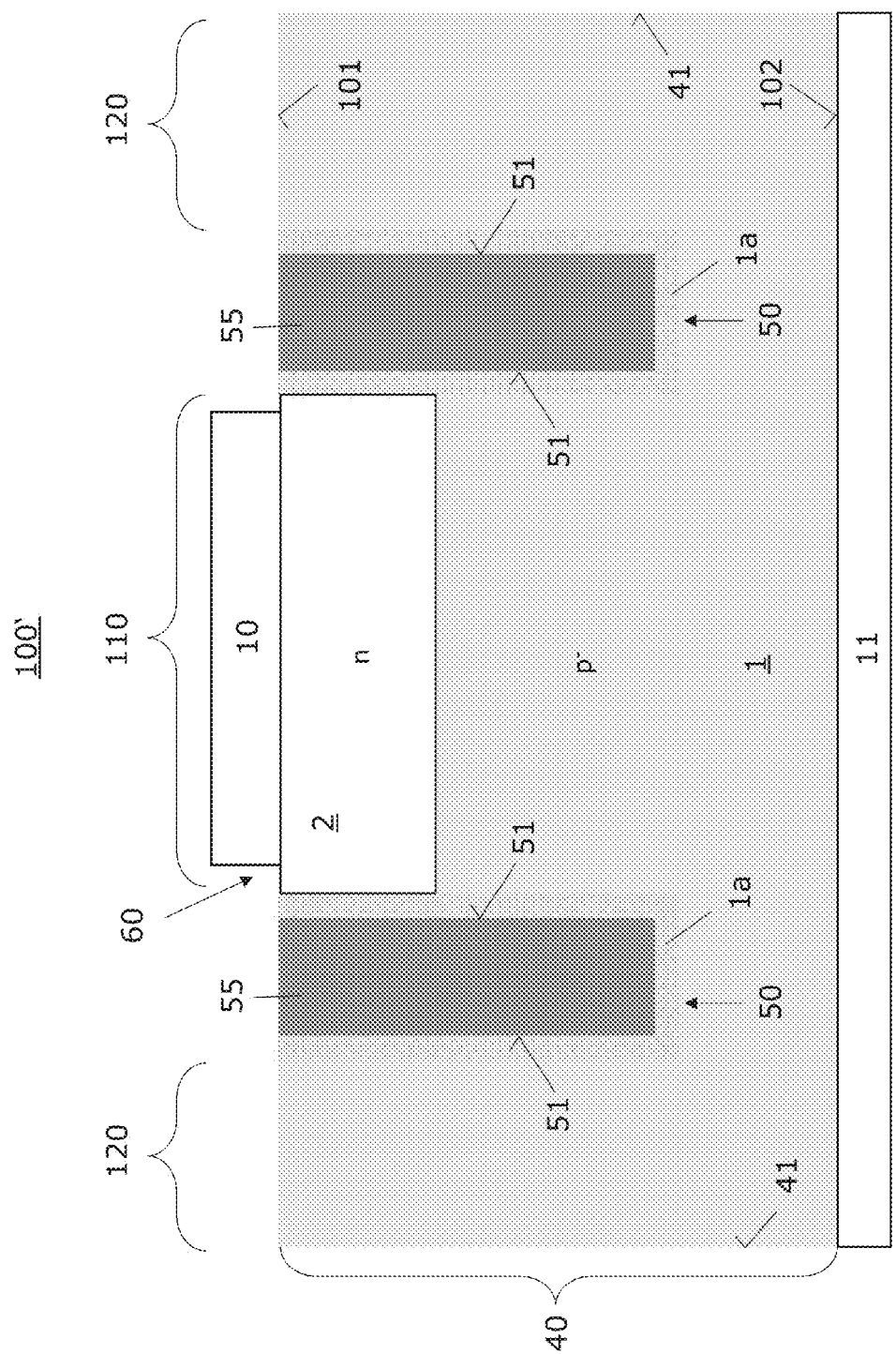
FIG. 9 illustrates a vertical cross-section through a power semiconductor device according to an embodiment.

The deep trench isolation 1a, 50, 55, may also be used to separate an active device area 110 from a peripheral area 120 surrounding the active device area 110 when seen from above and extending to an edge 41 delimiting the semiconductor body 40 in a direction parallel to the first side 101. This is illustrated in FIG. 9 for an exemplary vertical power diode 100' having in the active area 110 an n-type cathode region 2 forming a pn-junction with the semiconductor layer 1. Further, a cathode metallization 10 in Ohmic contact with the cathode region 2 is formed on the first side 101, and an anode metallization 12 in Ohmic contact with the semiconductor layer 1 is formed on the second side 102. The deep trench isolation 1a, 50, 55, may surround the active device area 110 when seen from above.

Due to the compensation semiconductor regions 1a, low leakage current during blocking mode of the power diode 100' can be ensured.

According to an embodiment, the power semiconductor device 100, 100' includes a semiconductor body 40 including a first side 101 and a semiconductor layer 1 of a first conductivity type extending to the first side, at least one deep trench isolation which extends from the first side 101 into the semiconductor layer 1 and includes, in a vertical cross-section perpendicular to the first side 101, two sidewalls 51, a dielectric region 55 extending between the two sidewalls 51, and fixed charges. A compensation semiconductor region 1a extends along the two sidewalls 51 and the dielectric region 55. In the vertical cross-section, an amount of dopants of the first conductivity type in the compensation semiconductor region 1a times a number of charge carriers per unit, which are provided by the dopants of the first conductivity type in compensation semiconductor region, is at least about an absolute value of a non-vanishing total charge of the fixed charges divided by the elementary charge. The total charge is of the same electric charge type as the charge carriers.

FIG. 10 to FIG. 13 illustrate processes of a method for forming a power semiconductor device 200.

Figure 10:
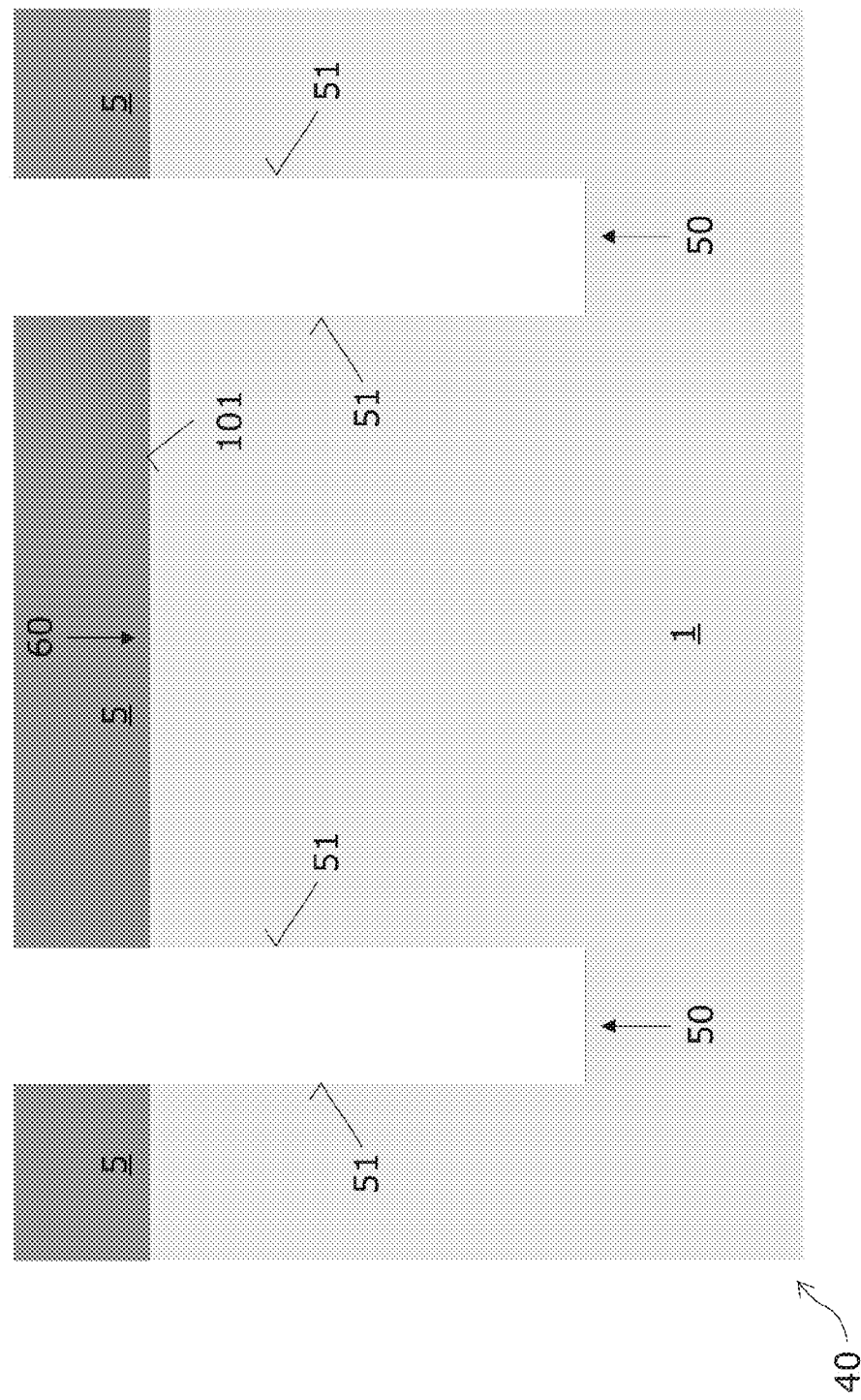
FIGS. 10 to 13 illustrate method steps of a method for forming a power semiconductor device on wafer level in respective vertical cross-sections through a wafer according to embodiments.

Similar as explained above with regard to FIG. 1, deep trenches 50 may be etched into a provided semiconductor layer 1 using a photo lithographically structured hardmask 5 formed thereon. The resulting structure 200 is shown in FIG. 10.

Figure 11:
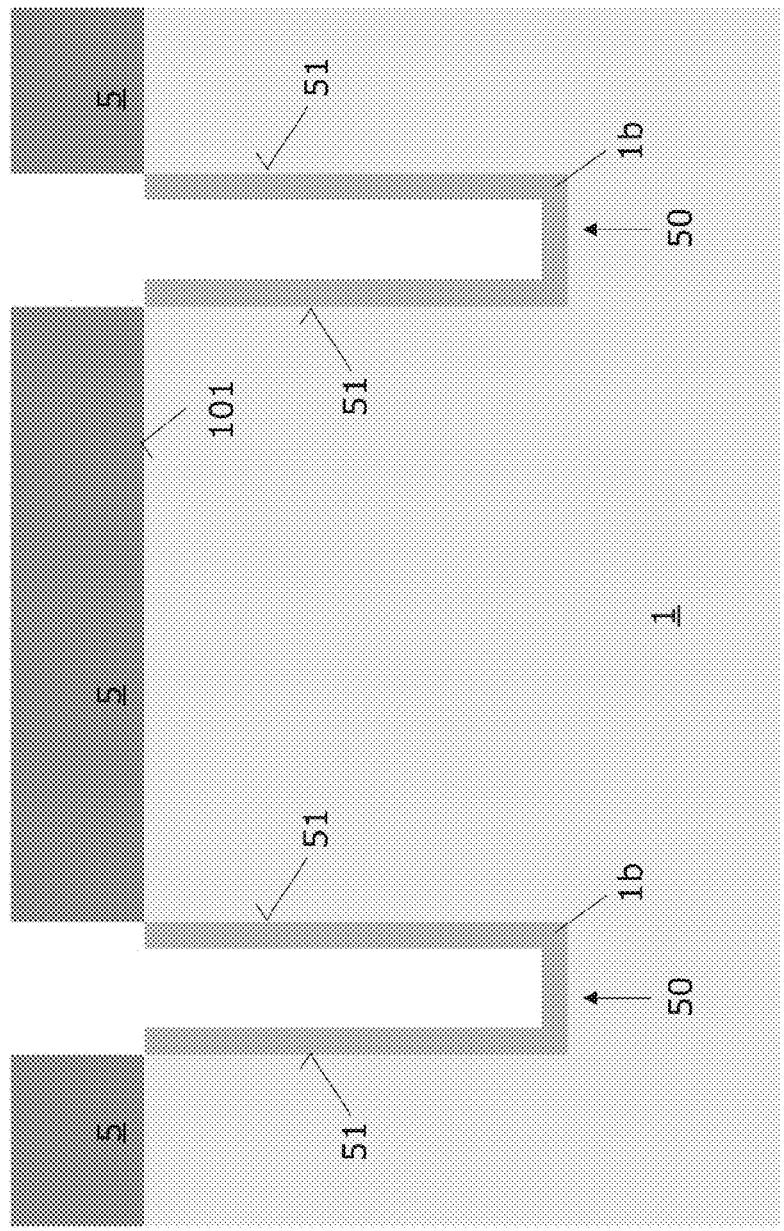

Thereafter, (boron) doped silicon may be deposited at the walls 51, 52 using selective epitaxy to form a compensation semiconductor regions 1b in each trench 50. The resulting structure 200 is shown in FIG. 11.

Figure 12:
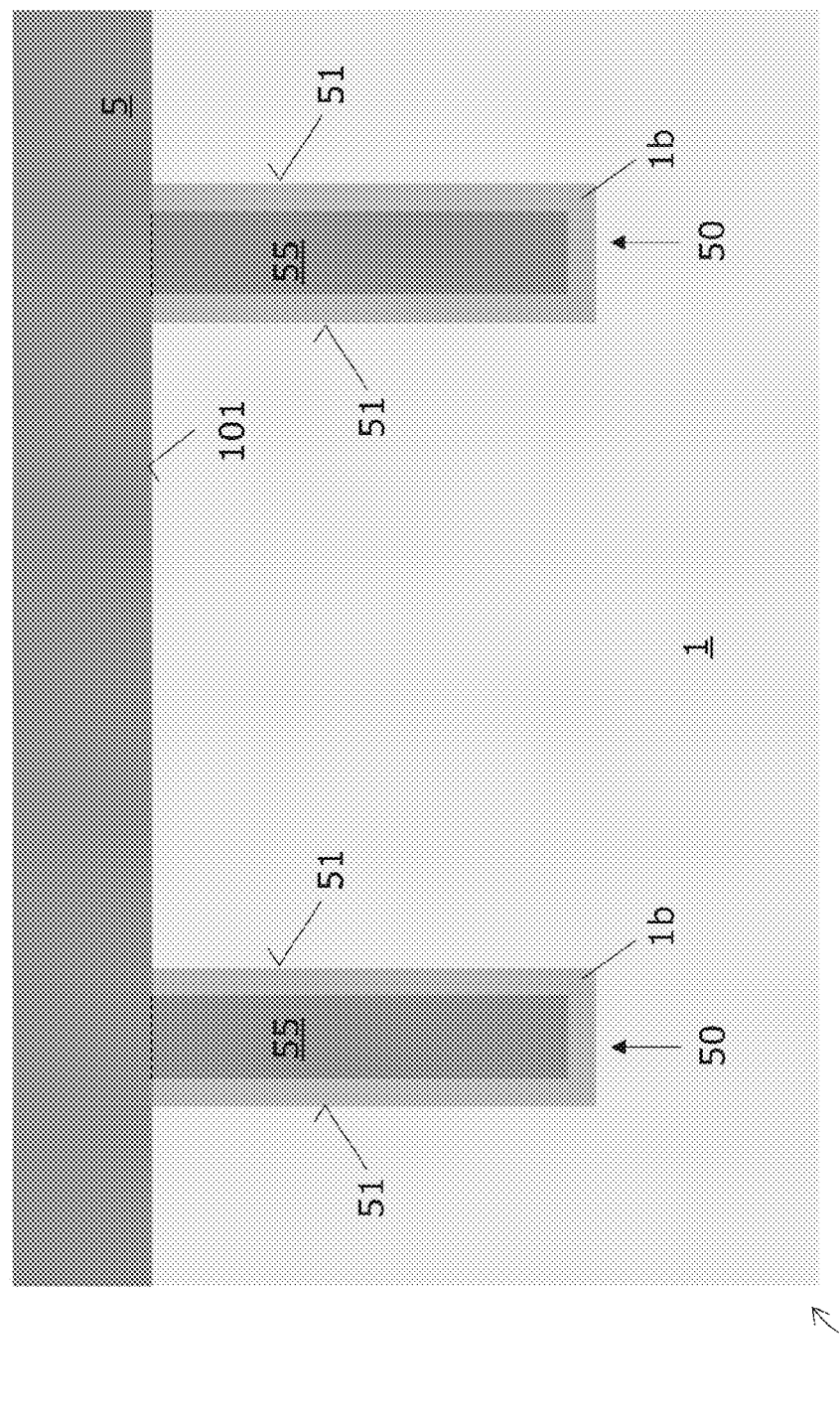

Thereafter, silicon oxide may be deposited to fill the trenches 50 with a dielectric region 55. The resulting structure 200 with two exemplary deep trench isolations is shown in FIG. 12.

In this embodiment, the compensation semiconductor regions 1b are also formed at the wall 51, 52 but inside the respective trench 50.

Figure 13:
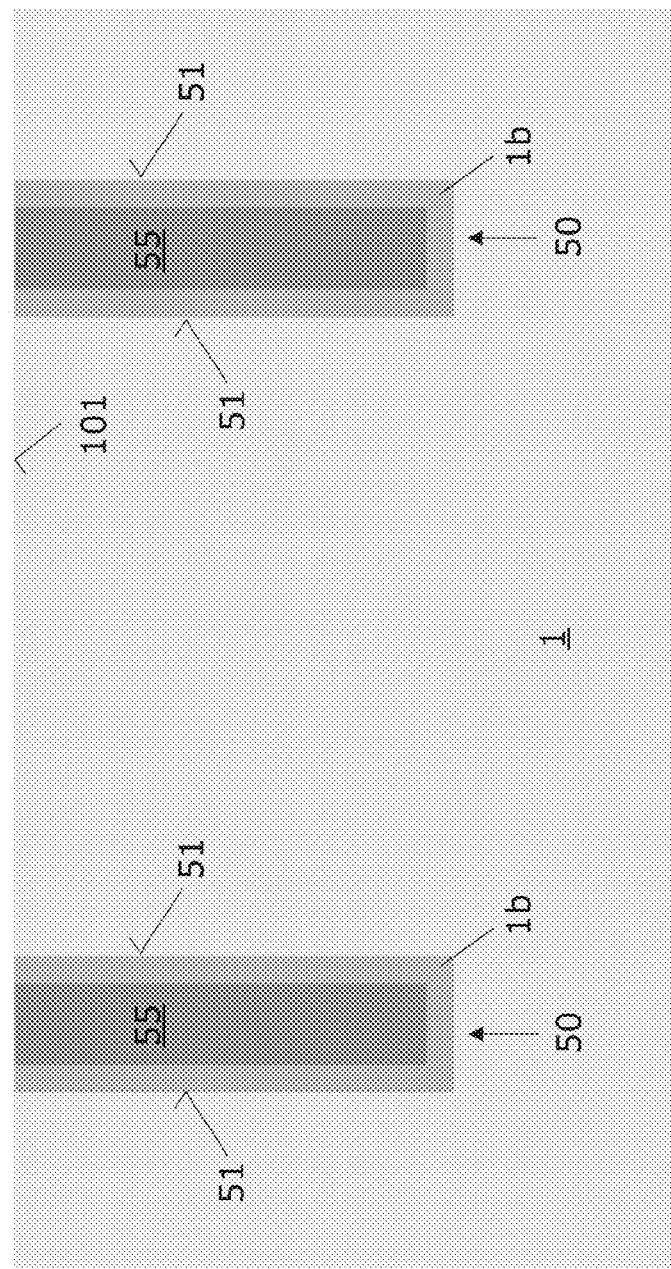

Thereafter, the mask 5 may be removed, e.g. by dry etching, wet etching and/or CMP. The resulting structure 200 is shown in FIG. 13.

After or prior to forming the deep trench isolations, further manufacturing processes may be used as explained above with regard to FIG. 8 and FIG. 9.

FIG. 14 to FIG. 17 illustrate processes of a method for forming a power semiconductor device 300.

Figure 14:
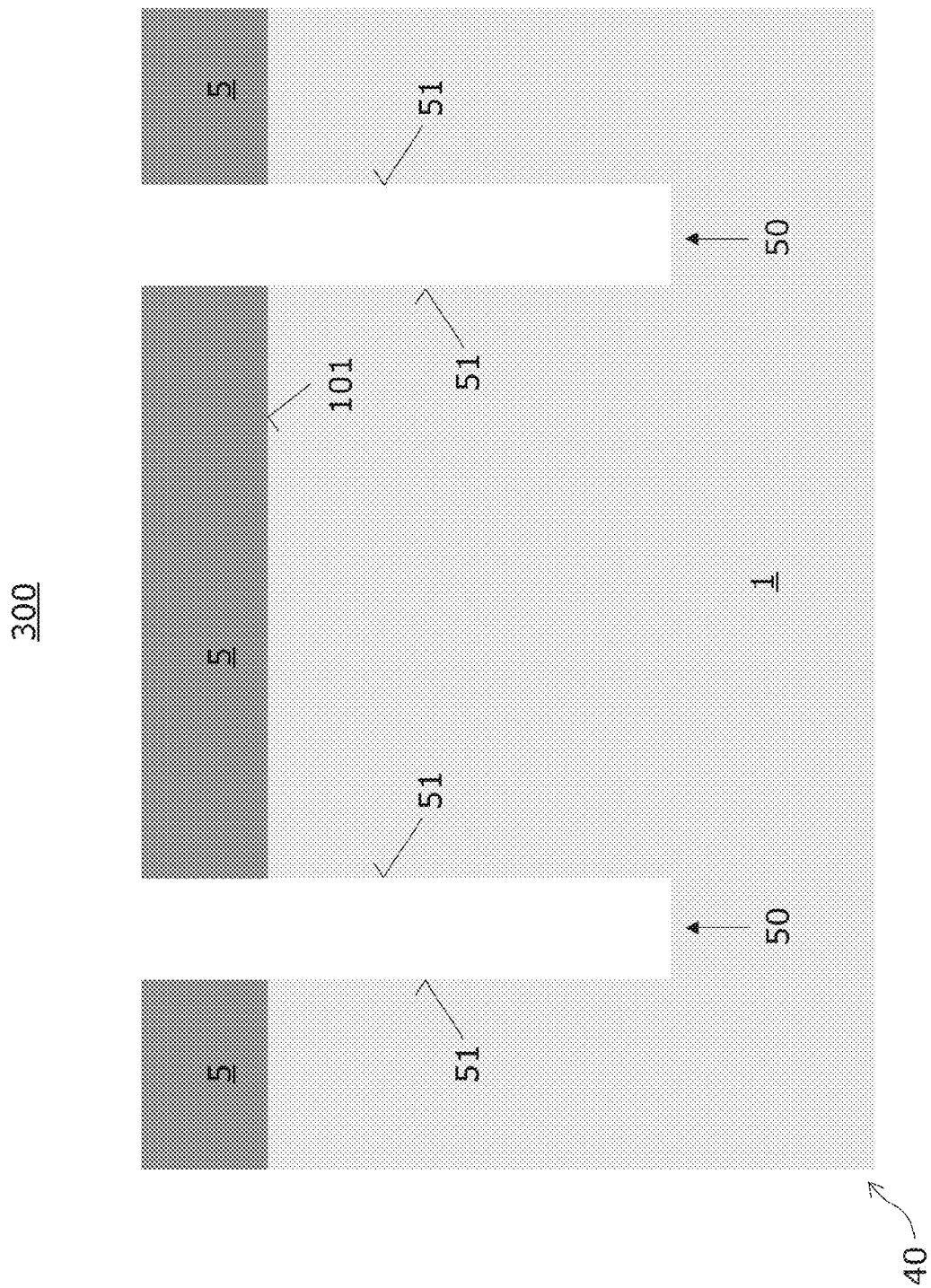
FIGS. 14 to 17 illustrate method steps of a method for forming a power semiconductor device on wafer level in respective vertical cross-sections through a wafer according to further embodiments.

Similar as explained above with regard to FIG. 1, deep trenches 50 may be etched into a provided semiconductor layer 1 using a photo lithographically structured hardmask 5 formed thereon. The resulting structure 300 is shown in FIG. 14.

Figure 15:
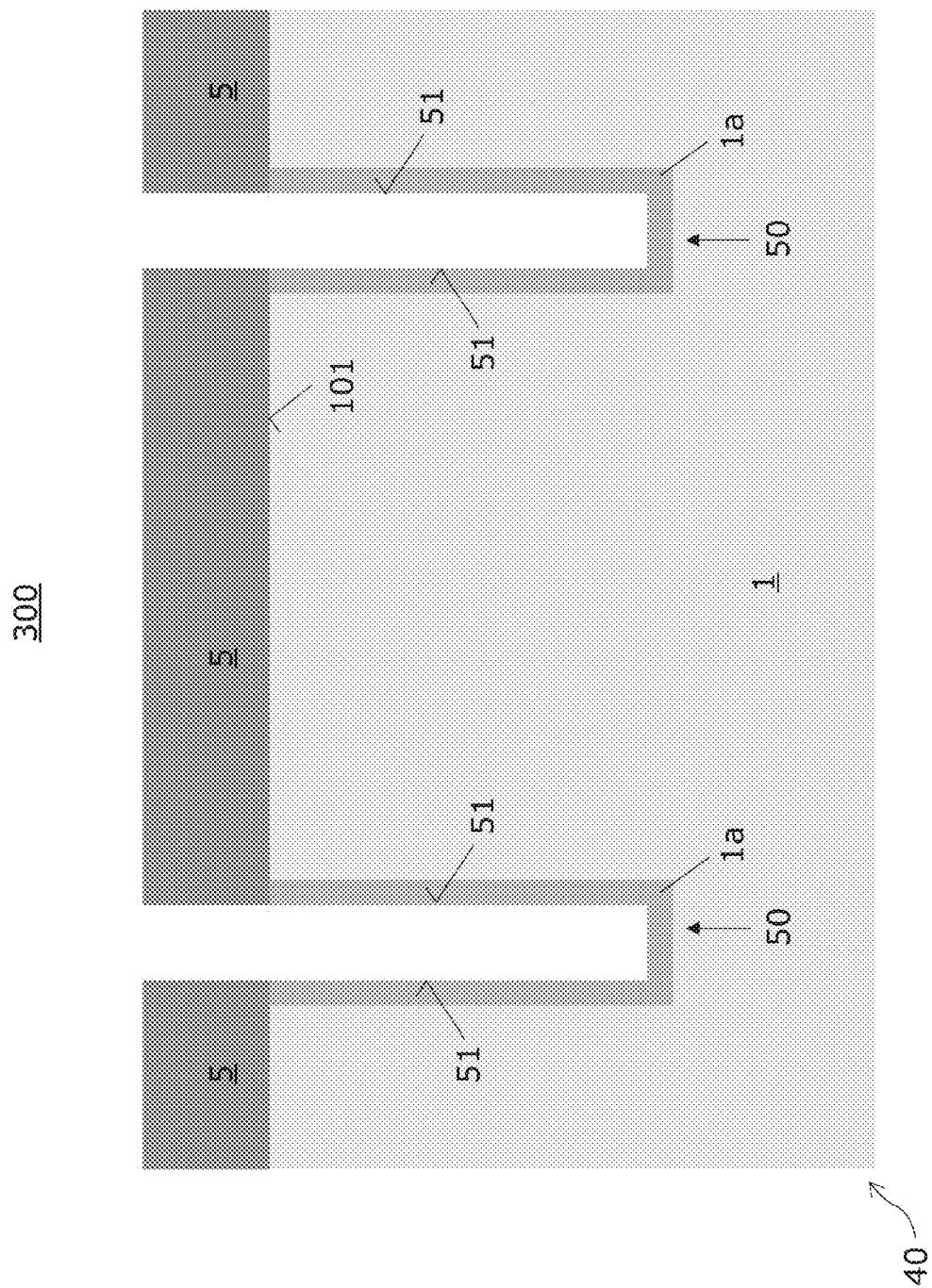

Thereafter, gas phase doping may be used for insitu doping and diffusion of first dopants into portions of the semiconductor layer 1 at the walls 51, 52. Accordingly, compensation semiconductor regions 1a may be formed at the walls 51, 52. The resulting structure 300 is shown in FIG. 15.

Figure 16:
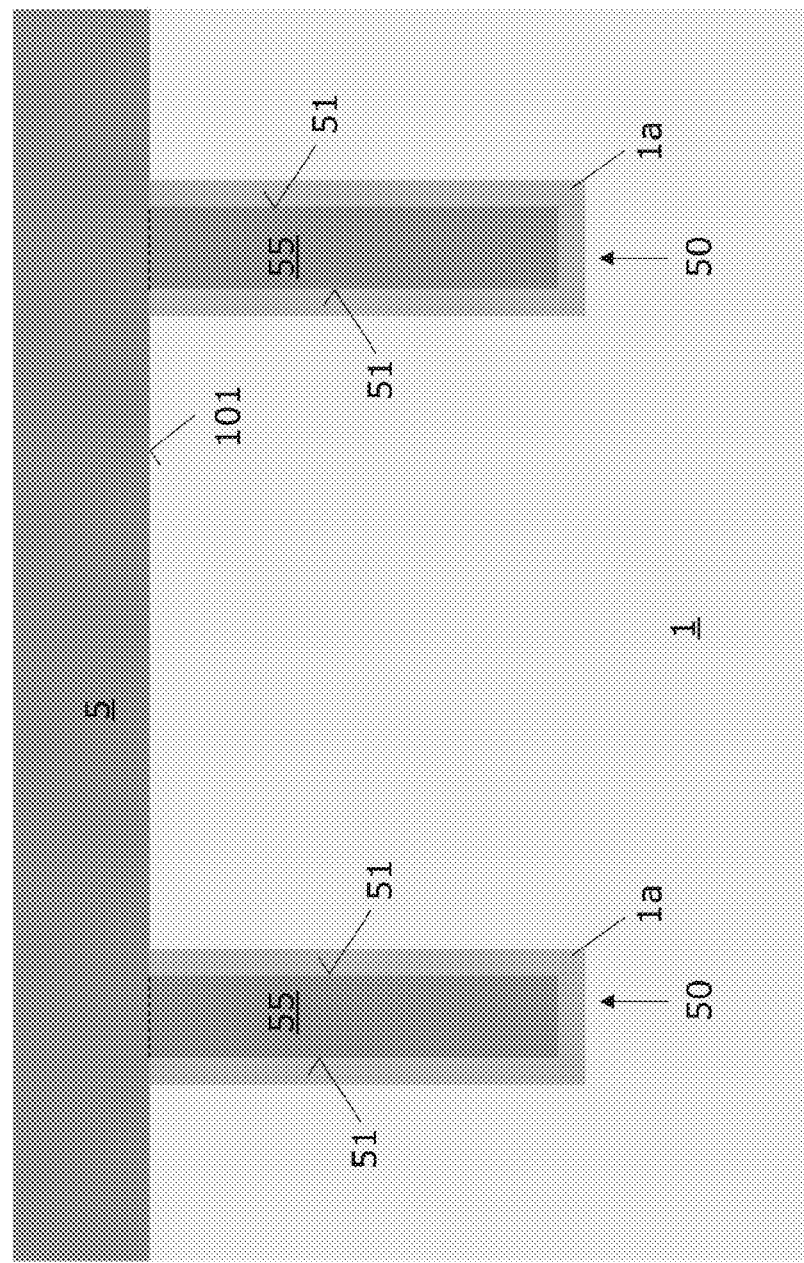

Thereafter, silicon oxide may be deposited to fill the trenches 50 with a dielectric region 55. The resulting structure 300 with two exemplary deep trench isolations is shown in FIG. 16.

Figure 17:
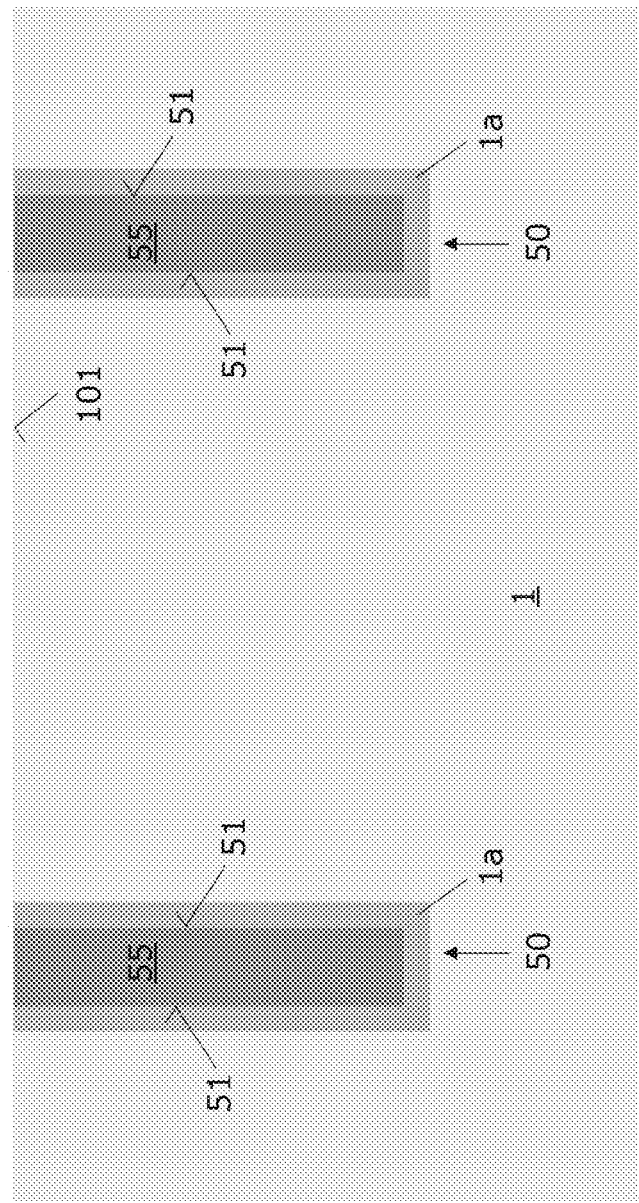

Thereafter, the mask 5 may be removed, e.g. by dry etching, wet etching and/or CMP. The resulting structure 200 is shown in FIG. 17.

After or prior to forming the deep trench isolations, further manufacturing processes may be used as explained above with regard to FIG. 8 and FIG. 9.

FIG. 18 to FIG. 21 illustrate processes of a method for forming a power semiconductor device 400.

Similar as explained above with regard to FIG. 1, deep trenches 50 may be etched into a provided semiconductor layer 1 using a photo lithographically structured hardmask 5 formed thereon.

Figure 18:
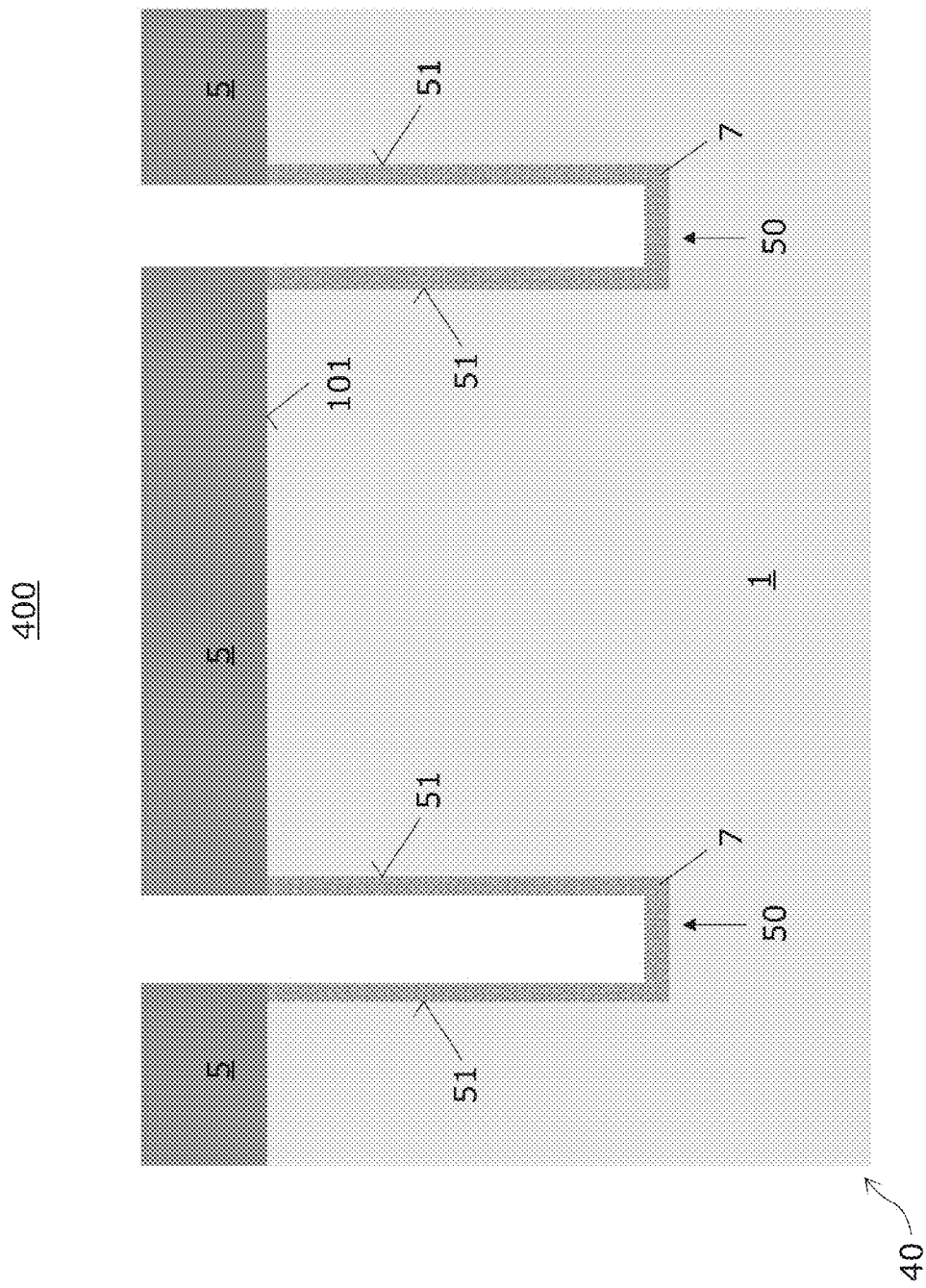
FIGS. 18 to 21 illustrate method steps of a method for forming a power semiconductor device on wafer level in respective vertical cross-sections through a wafer according to yet further embodiments.

Thereafter, a first silicon oxide layer 7 highly doped with the first dopants, e.g. boron doped silicon oxide, may be deposited to cover the sidewalls 51 and the bottom walls 52. The resulting structure 400 is illustrated in FIG. 18.

Figure 19:
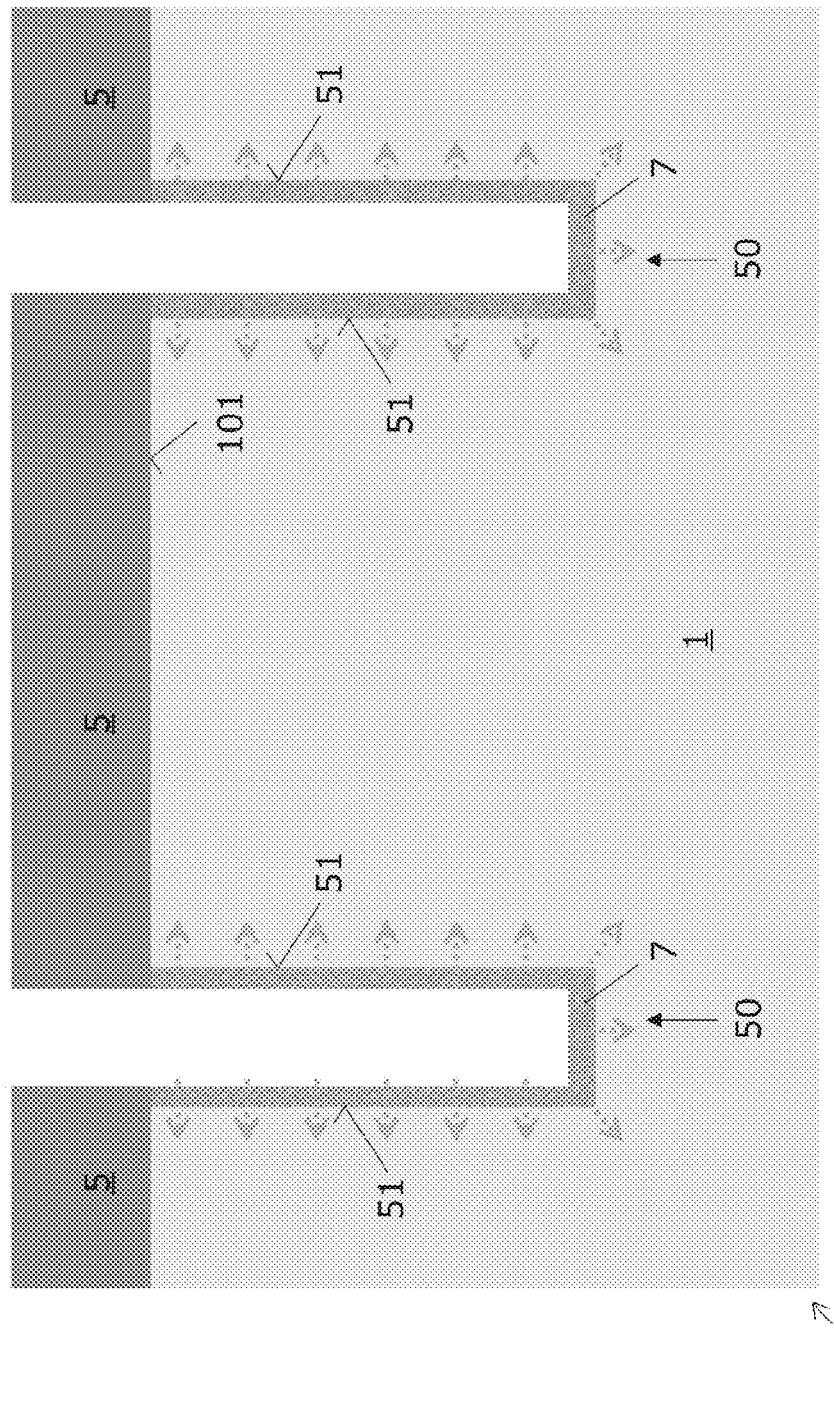

Thereafter, an outdiffusion anneal may be used to introduce the first dopants into the semiconductor layer 1 as illustrated by the dashed-dotted arrows in FIG. 19.

Figure 20:
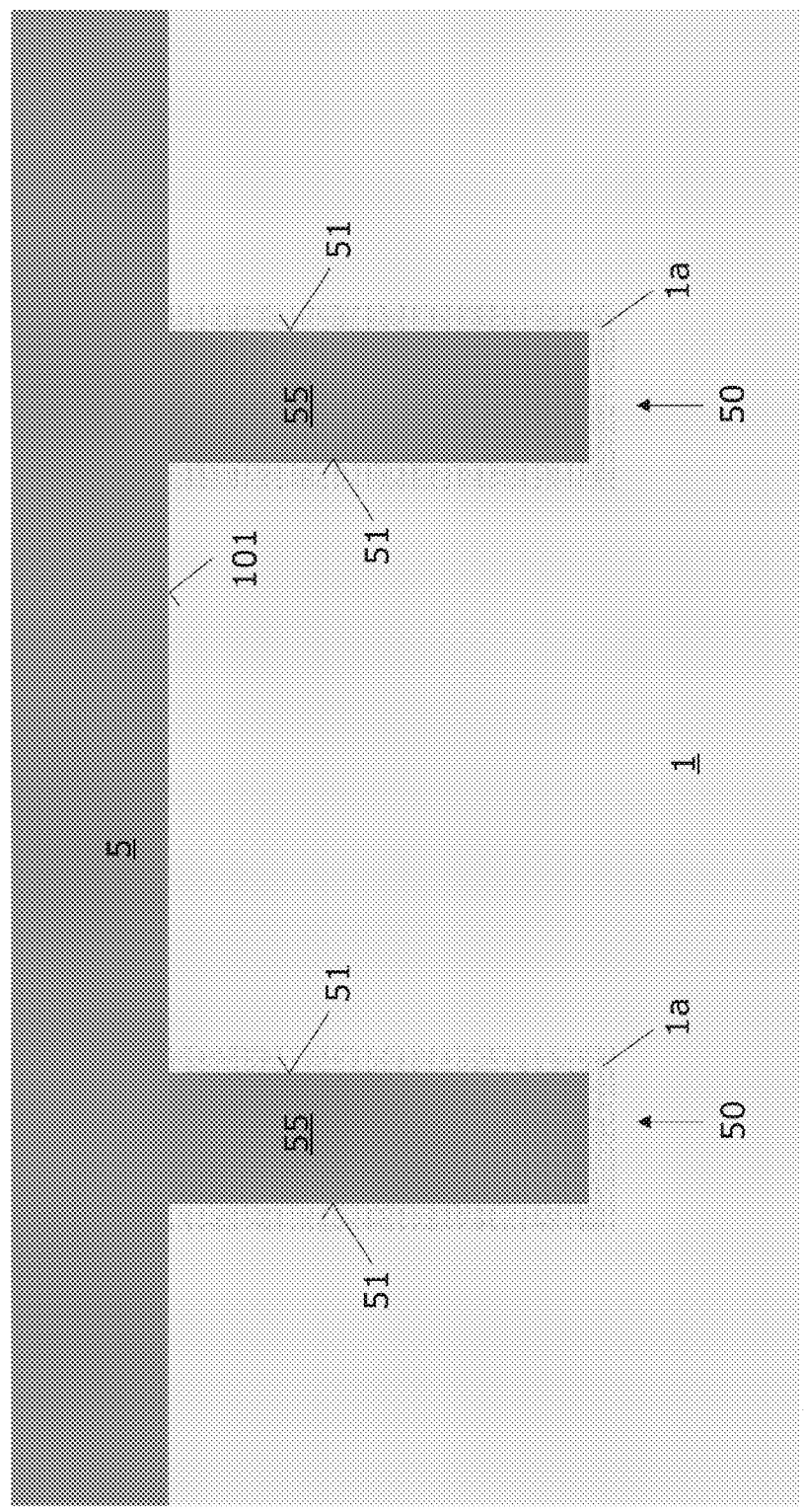

Accordingly, compensation semiconductor regions 1a may be formed at the walls 51, 52. The resulting structure 400 is shown in FIG. 20.

A separate outdiffusion anneal may also be omitted, if later thermal processes are used for further device processing.

Thereafter, silicon oxide may be deposited to fill the trenches 50 with a dielectric region 55. The resulting structure 400 with two exemplary deep trench isolations is shown in FIG. 20.

Figure 21:
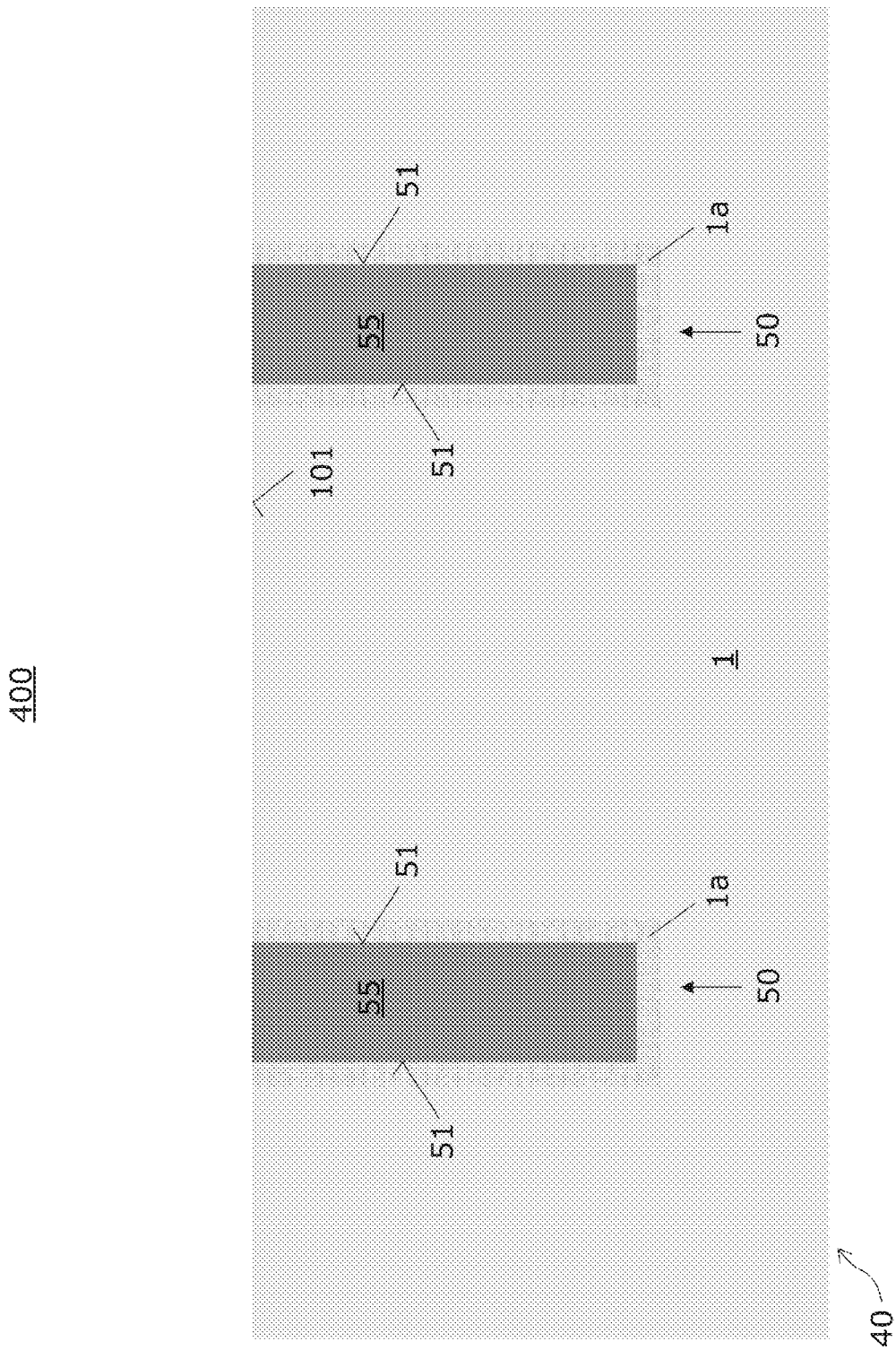

Thereafter, the hard mask 5 may be removed, e.g. by dry etching, wet etching and/or CMP. The resulting structure 400 is shown in FIG. 21.

After or prior to forming the deep trench isolations, further manufacturing processes may be used as explained above with regard to FIG. 8 and FIG. 9.

The methods described above with regard to the FIGS. 1 to 21 may be described as providing a semiconductor layer of a first conductivity type extending to a first side and having a first doping concentration of first dopants providing majority charge carriers of a first electric charge type in the semiconductor material of the semiconductor layer and forming a deep trench isolation. Forming the deep trench isolation includes forming a trench from the first side into the semiconductor layer, the trench having, in a vertical cross-section perpendicular to the first side, a sidewall, forming a typically thin compensation semiconductor region of the first conductivity type at and along the sidewall, the compensation semiconductor region having a second doping concentration of the first dopants higher than the first doping concentration, and filling the trench with a dielectric material. The method is performed so that the first dopants in the compensation semiconductor region mainly compensate, substantially compensate or even overcompensate a field-effect, in particular field induced leakage paths, of fixed charges of the first electric charge type, which are trapped in the trench, in the semiconductor material next to the dielectric material.

In one embodiment, the semiconductor layer is a typically low-doped p-type silicon layer and the dielectric material is silicon oxide. Without the higher p-doped silicon compensation semiconductor region, the intrinsic amount of trapped positive charges in the dielectric material of the deep trench isolation, a leakage path may be formed along the silicon/silicon oxide interface and hinder a decent voltage blocking. This can be avoided by the compensation semiconductor region.

Likewise, a higher n-doped compensation semiconductor region may be used for an n-type semiconductor layer and a trench dielectric with trapped negative charges.

According to an embodiment of a method of forming a power semiconductor device, the method includes providing a semiconductor layer of a first conductivity type extending to a first side and comprising a first doping concentration of first dopants providing majority charge carriers of a first electric charge type in the semiconductor layer, and forming a deep trench isolation. Forming the deep trench isolation includes forming a trench which extends from the first side into the semiconductor layer and comprises, in a vertical cross-section perpendicular to the first side, a sidewall, forming a compensation semiconductor region of the first conductivity type at and along the sidewall, the compensation semiconductor region including a second doping concentration of the first dopants which is higher than the first doping concentration, and filling the trench with a dielectric material. An amount of the first dopants in the compensation semiconductor region is chosen so that a field-effect of fixed charges of the first electric charge type which are trapped in the trench is at least partly compensated.

Figure 22:
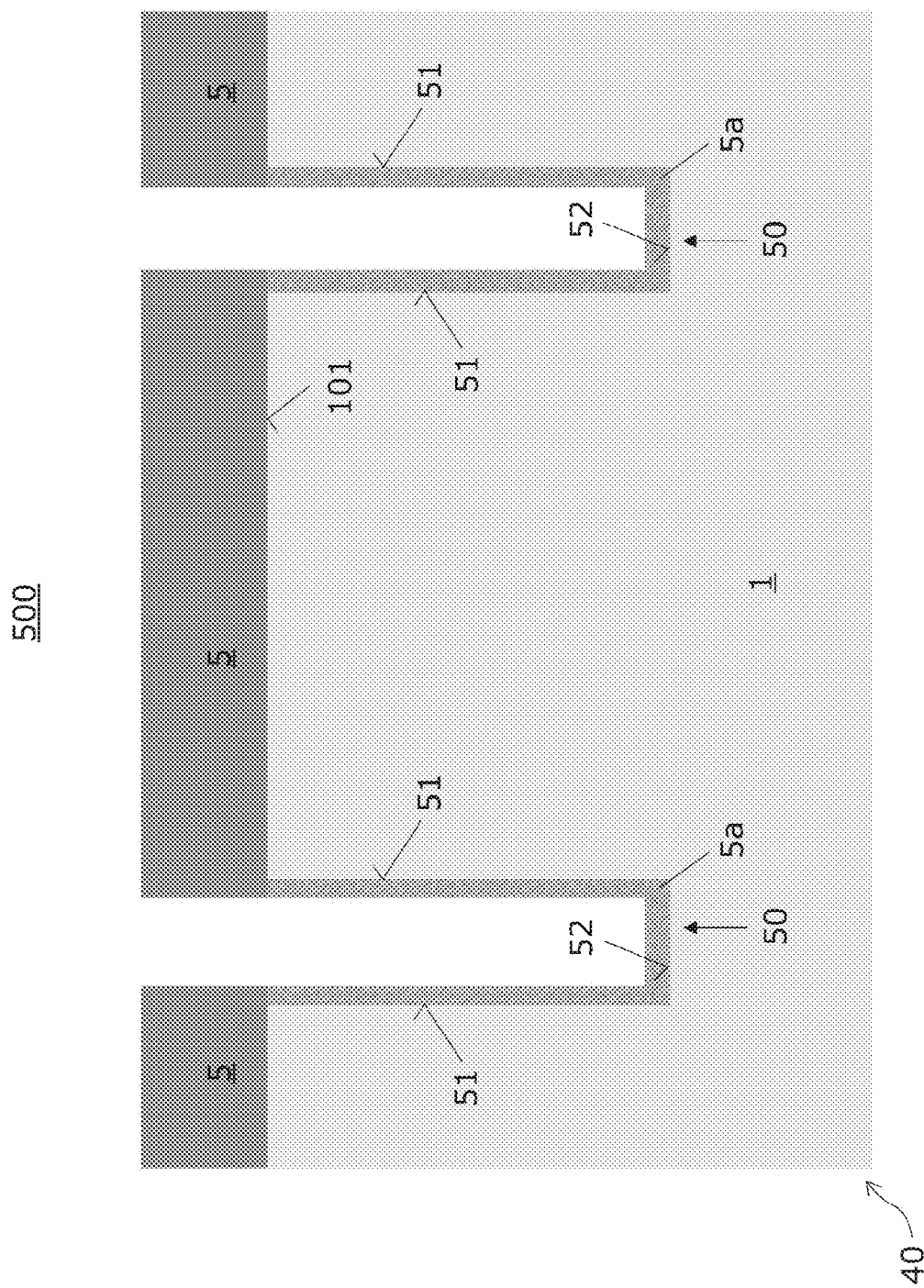
FIGS. 22 to 24 illustrate method steps of a method for forming a power semiconductor device on wafer level in respective vertical cross-sections through a wafer according to further embodiments.
Figure 23:
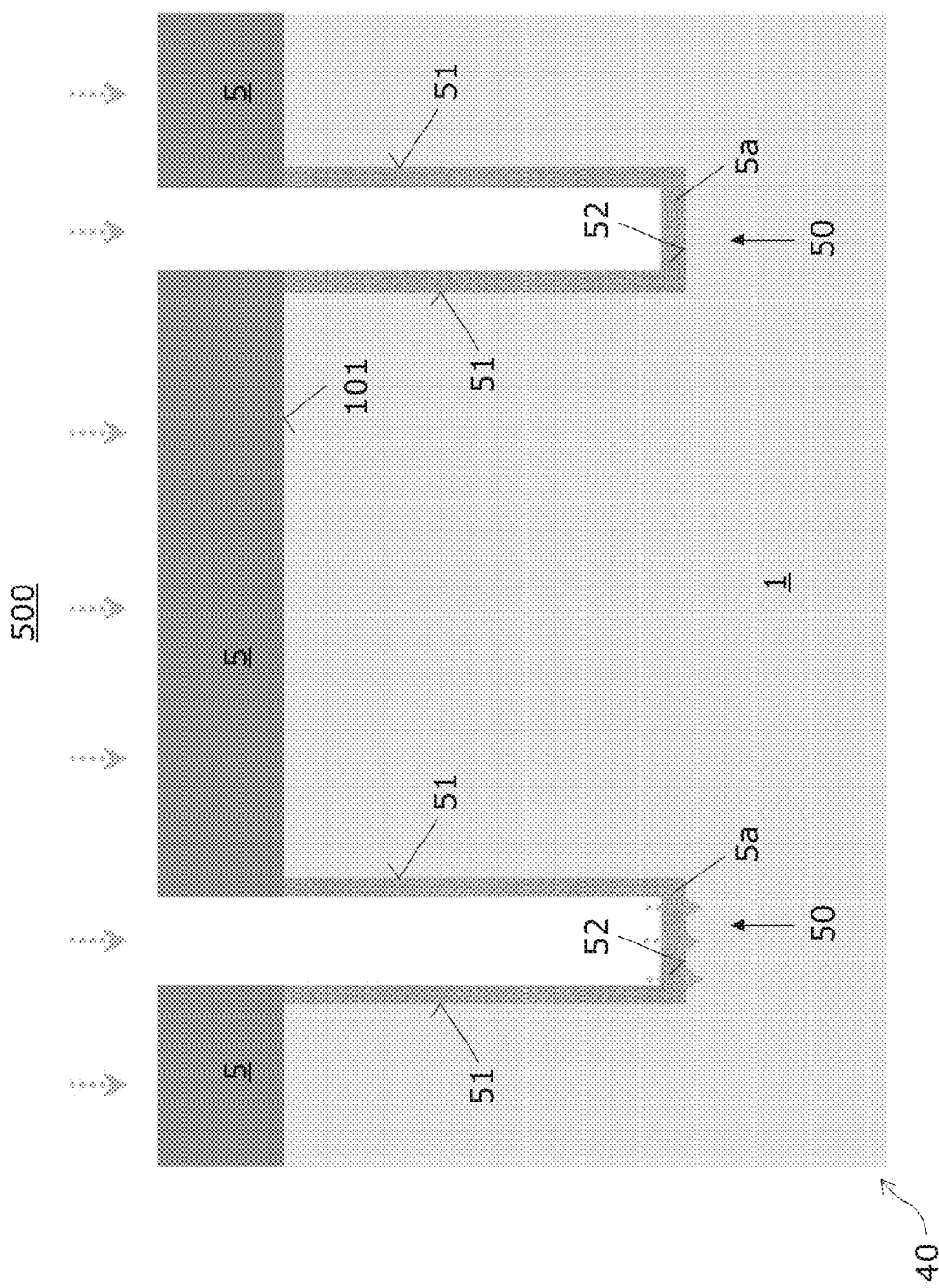
Figure 24:
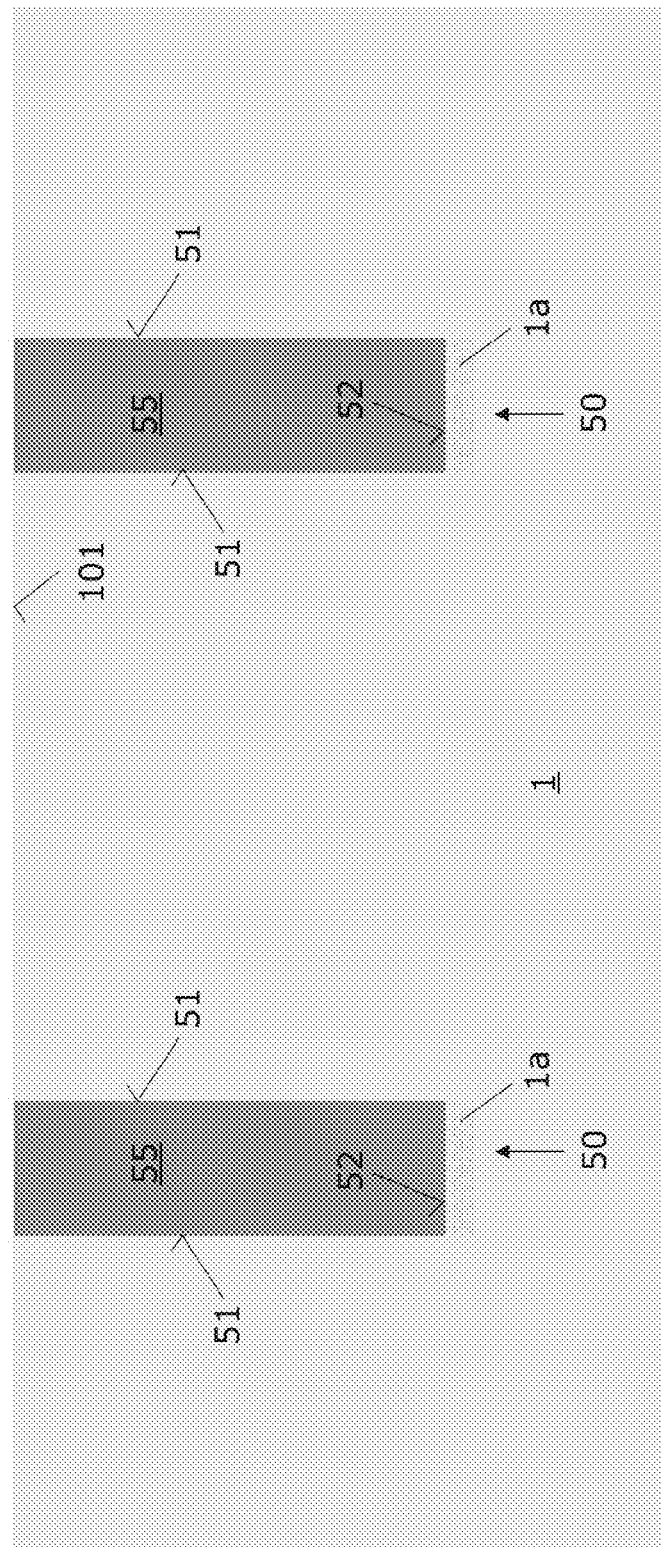

FIG. 22 to FIG. 24 illustrate processes of a method for forming a power semiconductor device 500.

Similar as explained above with regard to FIG. 1, deep trenches 50 may be etched into a provided semiconductor layer 1 using a photo lithographically structured hardmask 5 formed thereon.

Thereafter, a first silicon oxide layer 5a may be deposited to cover at least the bottom walls 52. The resulting structure 500 is illustrated in FIG. 22.

Thereafter, first dopants, e.g. boron, may be implanted from the first side 101 as indicated by the dotted arrows in FIG. 23.

Depending on thickness of first silicon oxide layer 5a and implantation energy, the first dopants may even be implanted through the bottom wall(s) 52.

Thereafter, a thermal process may be used to further outdiffuse and/or activate implanted dopants. Accordingly, compensation semiconductor regions 1a may be formed at the bottom walls 52 only.

A separate thermal process may also be omitted, if later thermal processes are used for further device processing.

Thereafter, silicon oxide may be deposited to fill the trenches 50 with a dielectric region 55.

Thereafter, the hard mask 5 may be removed, e.g. by dry etching, wet etching and/or CMP. The resulting structure 500 is shown in FIG. 24.

After or prior to forming the deep trench isolations, further manufacturing processes may be used as explained above with regard to FIG. 8 and FIG. 9.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for forming a power semiconductor device, the method comprising:
   providing a semiconductor layer of a first conductivity type extending to a first side and comprising a first doping concentration of first dopants providing majority charge carriers of a first electric charge type in the semiconductor layer; and
   forming a deep trench isolation, comprising:
      forming a trench which extends from the first side into the semiconductor layer and comprises, in a vertical cross-section perpendicular to the first side, a wall;
      forming a compensation semiconductor region of the first conductivity type at the wall, the compensation semiconductor region comprising a second doping concentration of the first dopants higher than the first doping concentration; and
      filling the trench with a dielectric material,
   wherein an amount of the first dopants in the compensation semiconductor region is such that a field-effect of fixed charges of the first electric charge type, which are trapped in the trench, is, next to the wall, at least partly compensated.

2. The method of claim 1, wherein the amount of the first dopants in the compensation semiconductor region is such that forming a continuous depletion layer and/or a continuous inversion channel at or next to the wall is avoided, wherein the compensation semiconductor region extends substantially along the wall, wherein the wall comprises a side portion and/or a bottom portion, wherein the compensation semiconductor region is formed at the side portion and the bottom portion.

3. The method of claim 1, wherein the first dopants provide a first number of the majority charge carriers per unit, and that a first value, which is defined as a product of the first number and a first quantity, is at least half about a second value defined as a ratio between a second quantity and the elementary charge, wherein the first quantity is obtainable by determining a first line integral of the second concentration along a first curve which runs through the compensation semiconductor region, wherein the second quantity is obtainable by determining a second line integral of a concentration of the fixed charges along a second curve which runs through the trench, and wherein the first curve and the second curve form respective line segments of a straight line perpendicular to the wall.

4. The method of claim 1, wherein filling the trench comprises at least one of:
   depositing a first oxide;
   depositing an oxide doped with the first dopants; and
   depositing a second oxide.

5. The method of claim 1, wherein the second doping concentration is at least one order of magnitude higher than the first doping concentration, and/or wherein the first doping concentration is in a range between about $10^{15}/cm^3$ and about $10^{16}/cm^3$.

6. The method of claim 1, wherein a thickness of the compensation semiconductor region is in a range from about 5 nm to about 100 nm.

7. The method of claim 1, wherein at least one of an extension of the compensation semiconductor region and an extension of the trench is, in a direction perpendicular to the first side, at least about 5 μm.

8. The method of claim 1, wherein the semiconductor layer and the compensation semiconductor region comprise silicon, wherein the dielectric material comprises silicon oxide, and/or wherein the first dopants are boron atoms.

9. The method of claim 1, wherein forming the compensation semiconductor region comprises at least one of:
   increasing a doping concentration of the first dopants at the wall by a factor of at least ten;
   forming a doped semiconductor layer comprising the first dopants inside the trench and on the wall;
   diffusing the first dopants from the doped layer into the semiconductor layer;
   depositing poly-silicon comprising the first dopants;
   selective epitaxial depositing of the semiconductor material comprising the first dopants;
   depositing a silicon oxide comprising the first dopants;
   introducing the first dopants into the semiconductor layer comprising gas phase doping; and implanting the first dopants from the first side and/or through a bottom portion of the wall.

10. The method of claim 1, further comprising at least one of:
estimating the amount of the fixed charges expected due to filling the trench; and
using the amount of fixed charges to calculate a desired amount of the first dopants of the compensation semiconductor region.

11. The method of claim 1, further comprising at least one of:
forming next to the trench a first field-effect structure;
forming next to the trench a first diode structure;
forming next to the trench a second field-effect structure so that the trench is arranged between the second field-effect structure and at least one of the first field-effect structure and the first diode structure; and
forming next to the trench a second diode structure so that the trench is arranged between the second diode structure and at least one of the first field-effect structure and the first diode structure.

12. The method of claim 1, wherein at least two trenches are formed.

13. The method of claim 1, wherein the dielectric material is, in the vertical cross-section, surrounded by the compensation semiconductor region except at the first side.

14. The method of claim 1, wherein the compensation semiconductor region is, in the vertical cross-section, substantially centered with respect to the trench.

15. The method of claim 3, wherein at least one of the first value is in a range between about $10^{10}/cm^2$ and about $10^{11}/cm^2$, the first value is less than about the second value and the first value substantially matches half the second value.

16. A method for forming a power semiconductor device, the method comprising:
providing a wafer comprising a first side and a semiconductor layer comprising first dopants of a first conductivity type and providing majority charge carriers of a first electric charge type in the semiconductor layer;
etching a trench from the first side into the semiconductor layer, in a vertical cross-section perpendicular to the first side, the trench comprising two sidewalls;
forming a compensation semiconductor region of the first conductivity type extending along the two sidewalls; and
filling the trench with a dielectric material,
wherein in the vertical cross-section, an amount of dopants of the first conductivity type in the compensation semiconductor region times a number of majority charge carriers per unit, which are provided by the dopants of the first conductivity type in the compensation semiconductor region, is at least about an absolute value of a non-vanishing total charge of trapped charges in the trench divided by the elementary charge, and the total charge is of the same electric charge type as the majority charge carriers.

17. The method of claim 16, wherein the amount of dopants of the first conductivity type in the compensation semiconductor region times a number of majority charge carriers per unit is less than about twice the absolute value of the non-vanishing total charge of trapped charges in the trench divided by the elementary charge.

18. A power semiconductor device, comprising:
a semiconductor body comprising a first side and a semiconductor layer extending to the first side and comprising first dopants providing majority charge carriers of a first electric charge type in the semiconductor layer;
at least one deep trench extending from the first side into the semiconductor layer and comprising, in a vertical cross-section perpendicular to the first side, a wall and a dielectric region comprising fixed charges of the first electric charge type; and
a compensation semiconductor region arranged at the wall and the semiconductor layer, and comprising a higher concentration of first dopants than the semiconductor layer,
wherein the dielectric region extends along the wall and/or along the compensation semiconductor region,
wherein an amount of the first dopants in the compensation semiconductor region is such that a field-effect of the fixed charges is, next to the wall, at least partly compensated.

19. The power semiconductor device of claim 18, wherein at least one of:
the amount of the first dopants in the compensation semiconductor region is such that the field-effect of the fixed charges is, next to the wall, substantially compensated;
the amount of the first dopants in the compensation semiconductor region is such that at least forming a continuous depletion layer at the wall is avoided;
an extension of the compensation semiconductor region is, in a direction perpendicular to an interface formed between the dielectric region and the compensation semiconductor region, in a range from about 5 nm to about 100 nm;
the semiconductor layer and the compensation semiconductor region comprise silicon;
the dielectric material comprises silicon oxide;
the first dopants are boron atoms;
the electric charge type is positive;
an extension of the at least one deep trench is, in a direction perpendicular to the first side, at least about 5 μm;
the power semiconductor device comprises a plurality of deep trench isolations; and
the at least one deep trench is arranged between an active area of the semiconductor device and an edge delimiting the semiconductor body in a direction parallel to the first side.

20. The semiconductor device of claim 18, in the vertical cross-section further comprising at least one of:
a semiconductor mesa arranged between two deep trench isolations each of which is formed by one of the at least one deep trench and a compensation semiconductor region;
a first field-effect structure next to the at least one deep trench isolation;
a first diode structure next to the at least one deep trench isolation;
a second field-effect structure, wherein the at least one deep trench is arranged between the second field-effect structure and at least one of the first field-effect structure and the first diode structure; and
a second diode structure, wherein the at least one deep trench is arranged between the second diode structure and at least one of the first field-effect structure and the first diode structure.

* * * * *